(12) United States Patent
Yagi et al.

(10) Patent No.: US 12,243,947 B2
(45) Date of Patent: Mar. 4, 2025

(54) AVALANCHE PHOTODIODE SENSOR AND DISTANCE MEASURING DEVICE INCLUDING CONCAVE-CONVEX PORTIONS FOR REDUCED REFLECTANCE

(71) Applicant: SONY SEMICONDUCTOR SOLUTIONS CORPORATION, Kanagawa (JP)

(72) Inventors: Shinichiro Yagi, Osaka (JP); Toshifumi Wakano, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 552 days.

(21) Appl. No.: 17/430,834

(22) PCT Filed: Feb. 6, 2020

(86) PCT No.: PCT/JP2020/004602
§ 371 (c)(1),
(2) Date: Aug. 13, 2021

(87) PCT Pub. No.: WO2020/170841
PCT Pub. Date: Aug. 27, 2020

(65) Prior Publication Data
US 2022/0140156 A1    May 5, 2022

(30) Foreign Application Priority Data
Feb. 21, 2019   (JP) .................. 2019-029912

(51) Int. Cl.
*H01L 31/02* (2006.01)
*G01S 7/481* (2006.01)
(Continued)

(52) U.S. Cl.
CPC ........ *H01L 31/02027* (2013.01); *G01S 7/481* (2013.01); *G01S 7/4863* (2013.01);
(Continued)

(58) Field of Classification Search
CPC ......... H01L 31/02027; H01L 27/14643; H01L 27/14629; H01L 27/14607;
(Continued)

(56) References Cited

U.S. PATENT DOCUMENTS

| 4,321,611 A | 3/1982 | Conti |
| 10,204,950 B1 | 2/2019 | Yamashita |

(Continued)

FOREIGN PATENT DOCUMENTS

| CN | 102334198 A | 1/2012 |
| CN | 105934826 A | 9/2016 |

(Continued)

OTHER PUBLICATIONS

International Search Report prepared by the Japan Patent Office on Apr. 2, 2020, for International Application No. PCT/JP2020/004602.

(Continued)

*Primary Examiner* — Jennifer D Bennett
*Assistant Examiner* — Erin R Garber
(74) *Attorney, Agent, or Firm* — SHERIDAN ROSS P.C.

(57) ABSTRACT

Distance measurement accuracy is improved. An avalanche photodiode sensor according to an embodiment includes a first semiconductor substrate and a second semiconductor substrate bonded to a first surface of the first semiconductor substrate, wherein the first semiconductor substrate includes a plurality of photoelectric conversion portions arranged in a matrix and an element separation portion, the plurality of photoelectric conversion portions include a first photoelectric conversion portion, the element separation portion has a first element separation region and a second element separation region, the first photoelectric conversion portion is arranged between the first element separation region and the second element separation region, the first semiconductor (Continued)

substrate further includes a plurality of concave-convex portions on a second surface opposite to the first surface and between the first element separation region and the second element separation region, and the second semiconductor substrate includes a reading circuit connected to each of the photoelectric conversion portions.

20 Claims, 29 Drawing Sheets

(51) Int. Cl.
    *G01S 7/4863*     (2020.01)
    *H01L 27/146*     (2006.01)
    *H01L 31/107*     (2006.01)

(52) U.S. Cl.
    CPC .... *H01L 27/14629* (2013.01); *H01L 27/1463* (2013.01); *H01L 27/14634* (2013.01); *H01L 27/14643* (2013.01); *H01L 31/107* (2013.01); H01L 27/14607 (2013.01); H01L 27/14636 (2013.01)

(58) Field of Classification Search
    CPC .......... H01L 27/14636; H01L 27/1463; H01L 27/14634; H01L 31/02161; H01L 31/02327; H01L 31/02363; H01L 31/02366; H01L 31/107; H01L 27/1464; G01S 7/4863; G01S 7/4865; G01S 17/42; G01S 17/10; G01S 7/481; G01S 17/08; Y02E 10/50
    See application file for complete search history.

(56) References Cited

U.S. PATENT DOCUMENTS

| | | | |
|---|---|---|---|
| 2011/0298076 | A1 | 12/2011 | Yamamura et al. |
| 2017/0278987 | A1* | 9/2017 | Choi ................. H01L 31/02327 |
| 2018/0090526 | A1 | 3/2018 | Mandal et al. |
| 2018/0090536 | A1 | 3/2018 | Mandai |
| 2019/0006399 | A1 | 1/2019 | Otake |
| 2019/0027518 | A1* | 1/2019 | Miyata .............. H01L 27/14621 |
| 2019/0252442 | A1 | 8/2019 | Tanaka et al. |
| 2019/0281241 | A1* | 9/2019 | Jin ....................... H04N 25/767 |
| 2020/0021754 | A1* | 1/2020 | Borthakur ............... H01L 33/20 |
| 2020/0028018 | A1* | 1/2020 | Iwata ...................... G01S 17/89 |

FOREIGN PATENT DOCUMENTS

| | | |
|---|---|---|
| CN | 108475689 A | 8/2018 |
| CN | 109155325 A | 1/2019 |
| CN | 109300992 A | 2/2019 |
| JP | 2008153311 A | 7/2008 |
| JP | 2015029054 A | 2/2015 |
| JP | 2017-108062 | 6/2017 |
| JP | 2018-088488 | 6/2018 |
| JP | 2018201005 A | 12/2018 |
| JP | 2019102618 A | 6/2019 |
| JP | 2019530215 A | 10/2019 |
| WO | WO 2017/038542 | 3/2017 |
| WO | WO-2017126329 A | 7/2017 |
| WO | WO 2018/042785 | 3/2018 |
| WO | WO-2018057975 A1 | 3/2018 |
| WO | WO 2018/074530 | 4/2018 |
| WO | WO-2021156444 A1 | 8/2021 |

OTHER PUBLICATIONS

Official Action for China Patent Application No. 202080008797.3, dated Jan. 6, 2025, 5 pages.

* cited by examiner

AVALANCHE PHOTODIODE SENSOR AND DISTANCE MEASURING DEVICE INCLUDING CONCAVE-CONVEX PORTIONS FOR REDUCED REFLECTANCE

CROSS REFERENCE TO RELATED APPLICATIONS

This application is a national stage application under 35 U.S.C. 371 and claims the benefit of PCT Application No. PCT/JP2020/004602 having an international filing date of 6 Feb. 2020, which designated the United States, which PCT application claimed the benefit of Japanese Patent Application No. 2019-029912 filed 21 Feb. 2019, the entire disclosures of each of which are incorporated herein by reference.

TECHNICAL FIELD

The present disclosure relates to an avalanche photodiode sensor and a distance measuring device.

BACKGROUND ART

A distance measuring image sensor that measures a distance using a time-of-flight (ToF) technique has attracted attention in recent years. For example, a pixel array formed by arranging a plurality of single photon avalanche diode (SPAR) pixels in a plane using a complementary metal oxide semiconductor (CMOS) semiconductor integrated circuit technology can be used for the distance measuring image sensor. In a SPAD pixel, avalanche amplification occurs if a photon enters its PN junction region of a high electric field while a voltage much higher than a breakdown voltage is being applied. Detecting the time when a current flows momentarily here enables distance measurement with high accuracy.

CITATION LIST

Patent Literature

[PTL 1] JP 2018-88488 A
[PTL 2] JP 2017-108062 A
[PTL 3] WO 2018/074530

SUMMARY

Technical Problem

The distance to an object is calculated based on light reflected by the object when the distance to the object is measured using the distance measuring image sensor as described above. Thus, when the amount of reflected light is small, such as that from a distant object, the reflected light may be buried in ambient light (also called disturbance light) and the distance measurement accuracy may decrease.

Therefore, the present disclosure proposes an avalanche photodiode sensor and a distance measuring device capable of improving the distance measuring precision.

Solution to Problem

In order to solve the above problems, an avalanche photodiode sensor according to the present disclosure includes a first semiconductor substrate and a second semiconductor substrate bonded to a first surface of the first semiconductor substrate, wherein the first semiconductor substrate includes a plurality of photoelectric conversion portions arranged in a matrix and an element separation portion for element-separating the plurality of photoelectric conversion portions from each other, the plurality of photoelectric conversion portions include a first photoelectric conversion portion, the element separation portion has a first element separation region and a second element separation region, the first photoelectric conversion portion is arranged between the first element separation region and the second element separation region, the first semiconductor substrate further includes a plurality of concave-convex portions arranged on a second surface opposite to the first surface and arranged between the first element separation region and the second element separation region, and the second semiconductor substrate includes a reading circuit connected to each of the photoelectric conversion portions.

DESCRIPTION OF EMBODIMENTS

Figure 1:
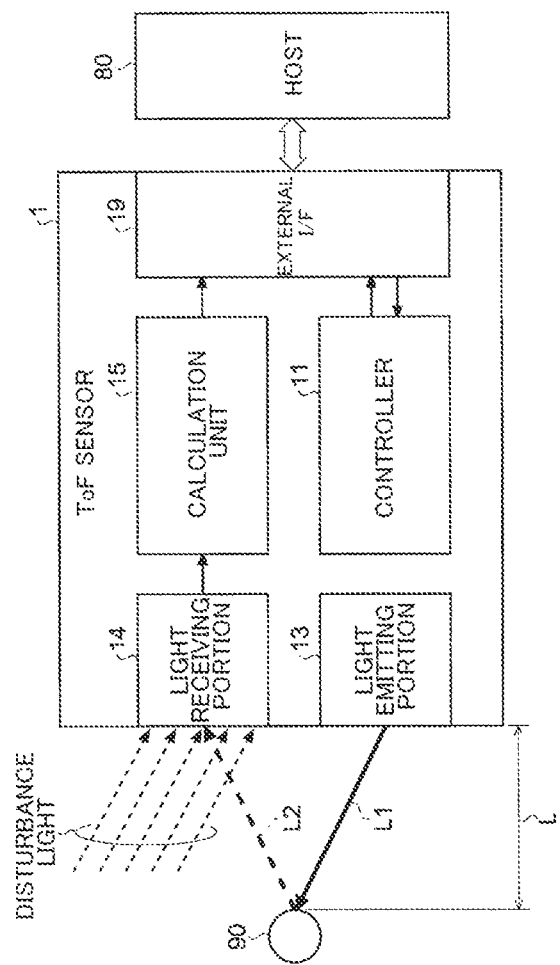
FIG. 1 is a block diagram showing an exemplary schematic configuration of a ToF sensor which is a distance measuring device according to a first embodiment.

Hereinafter, one embodiment of the present disclosure will be described in detail with reference to the drawings. In the following embodiments, the same parts are denoted by the same reference numerals and thus duplicate description will be omitted.

The present disclosure will be described in the order of items shown below.

1. First Embodiment
1.1 Distance measuring device (ToF sensor)
1.2 Optical system
1.3 Light receiving portion
1.4 SPAD array
1.5 SPAD pixel
1.6 Exemplary schematic operation of SPAD pixel
1.7 SPAD addition unit
1.8 Sampling period
1.9 Exemplary chip configuration
1.10 Exemplary cross-sectional structure
1.11 Moth-eye structure
1.12 Operation and advantages
1.13 Modifications
1.13.1 First modification
1.13.2 Second modification
1.13.3 Third modification
1.13.4 Fourth modification
1.13.5 Fifth modification
2. Second Embodiment
2.1 Exemplary cross-sectional structure
2.2 Operation and advantages
2.3 Modifications
2.3.1 First modification
2.3.2 Second modification
2.3.3 Third modification
2.3.4 Fourth modification
2.3.5 Fifth modification
3. Application examples 1. First Embodiment First, a first embodiment will be described in detail below with reference to the drawings.

1.1 Distance Measuring Device (ToF Sensor)

FIG. 1 is a block diagram showing an exemplary schematic configuration of a ToF sensor which is a distance measuring device according to the first embodiment. As shown in FIG. 1, the ToF sensor 1 includes a controller 11, a light emitting portion 13, a light receiving portion 14, a calculation unit 15, and an external interface (I/F) 19.

The controller 11 is composed, for example, of an information processing device such as a central processing unit (CPU) and controls each component of the ToF sensor 1.

The external I/F 19 may be, for example, a communication adapter for establishing communication with an external host 80 via a communication network compliant with any standard such as a wireless local area network (LAN), a wired LAN, a controller area network (CAN), a local interconnect network (LIN), or FlexRay (registered trademark).

Here, for example, when the ToF sensor 1 is mounted on an automobile or the like, the host 80 may be an engine control unit (ECU) mounted in the automobile or the like. When the ToF sensor 1 is mounted on an autonomous mobile body such as an autonomous mobile robot such as a domestic pet robot, a robot vacuum cleaner, an unmanned aerial vehicle, or a following transport robot, the host 80 may be a control device or the like that controls the autonomous mobile body.

The light emitting portion 13 includes, for example, one or a plurality of semiconductor laser diodes as a light source and emits laser light L1 in the form of a pulse having a predetermined time width with a predetermined period (also called a light emitting period). The light emitting portion 13 emits, for example, laser light L1 having a time width of 10 nanoseconds (ns) with a period of 100 megahertz (MHz). The laser light L1 emitted from the light emitting portion 13 is reflected by an object 90, for example, when the object 90 is within a distance measuring range, and the reflected light L2 is incident on the light receiving portion 14.

The light receiving portion 14 is an avalanche photodiode sensor, the details of which will be described later, and for example, includes a plurality of SPAD pixels arranged in a matrix and outputs information (for example, corresponding to the number of detection signals which will be described later) regarding the number of SPAD pixels which have each detected the incidence of a photon after the light emission of the light emitting portion 13 (hereinafter referred to as the number of detections). For example, the light receiving portion 14 detects the incidence of photons with a predetermined sampling period in response to one light emission of the light emitting portion 13 and outputs the number of detections.

The calculation unit 15 counts the number of detections output from the light receiving portion 14 for each plurality of SPAD pixels (for example, corresponding to one or a plurality of macro pixels which will be described later) and creates a histogram with the horizontal axis being the flight time and the vertical axis being a cumulative pixel value, based on a pixel value obtained by the counting. For example, the calculation unit 15 repeatedly executes the counting of the number of detections and the calculation of a pixel value at a predetermined sampling frequency in response to one light emission of the light emitting portion 13 for each of a plurality of light emissions of the light emitting portion 13, thereby creating a histogram in which the horizontal axis (histogram bin) is the sampling period corresponding to the flight time and the vertical axis is a cumulative pixel value obtained by accumulating the pixel value obtained in each sampling period.

Further, the calculation unit 15 applies a predetermined filtering process to the created histogram and then identifies a flight time at which the cumulative pixel value peaks from the filtered histogram. Then, the calculation unit 15 calculates the distance from the ToF sensor 1 or a device on which the ToF sensor 1 is mounted to the object 90 present in the distance measuring range based on the identified flight time. The distance information calculated by the calculation unit 15 may be output, for example, to the host 80 or the like via the external I/F 19.

1.2 Optical System

Figure 2:
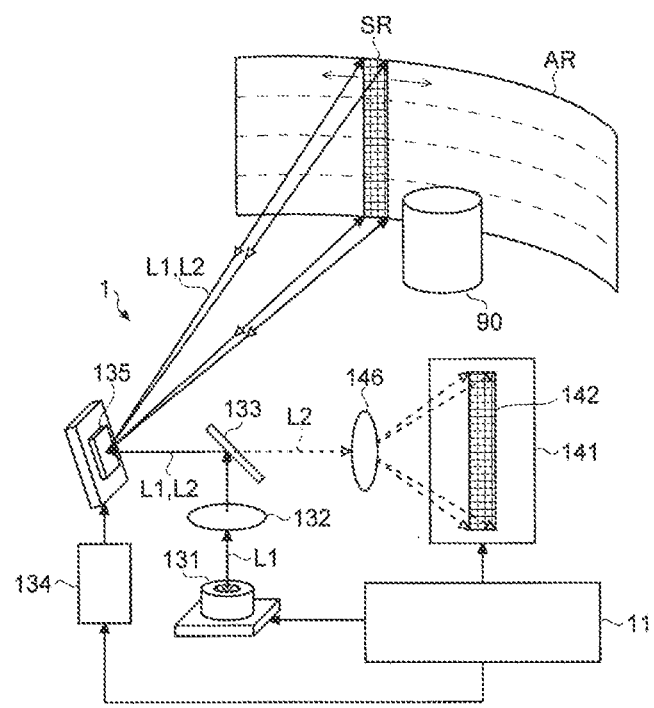
FIG. 2 is a diagram for explaining an optical system of the ToF sensor according to the first embodiment.

FIG. 2 is a diagram for explaining an optical system of the ToF sensor according to the first embodiment. FIG. 2 illustrates a so-called scan-type optical system that scans the angle of view of the light receiving portion 14 in the horizontal direction. However, the optical system of the ToF sensor is not limited to this and may be, for example, that of a so-called flash-type ToF sensor in which the angle of view of the light receiving portion 14 is fixed.

As shown in FIG. 2, the optical system of the ToF sensor 1 includes a light source 131, a collimator lens 132, a half mirror 133, a galvanometer mirror 135, a light receiving lens 146, and a SPAD array 141. The light source 131, the collimator lens 132, the half mirror 133, and the galvanometer mirror 135 are included, for example, in the light emitting portion 13 in FIG. 1. The light receiving lens 146 and the SPAD array 141 are included, for example, in the light receiving portion 14 in FIG. 1.

In the configuration shown in FIG. 2, laser light L1 emitted from the light source 131 is converted into rectangular parallel light whose cross-sectional intensity spectrum is long in the vertical direction through the collimator lens 132 and is then incident on the half mirror 133. The half mirror 133 reflects a part of the incident laser light L1. The laser light L1 reflected by the half mirror 133 is incident on the galvanometer mirror 135. The galvanometer mirror 135 vibrates in the horizontal direction with a predetermined rotation axis as the vibration center, for example, by a drive unit 134 that operates under the control of the controller 11. Thus, the laser light L1 is horizontally scanned such that the angle of view SR of the laser light L1 reflected by the galvanometer mirror 135 reciprocates across the ranging range AR in the horizontal direction. A micro-electro-mechanical system (MEMS), a micro motor, or the like can be used for the drive unit 134.

The laser light L1 reflected by the galvanometer mirror 135 is reflected by the object 90 present in the ranging range AR and the reflected light L2 is incident on the galvanometer mirror 135. A part of the reflected light L2 incident on the galvanometer mirror 135 is transmitted through the half mirror 133 and incident on the light receiving lens 146, whereby an image is formed on a specific region (hereinafter referred to as an effective region) 142 in the SPAD array 141. The effective region 142 may be the whole or a part of the SPAD array 141.

1.3 Light Receiving Portion

Figure 3:
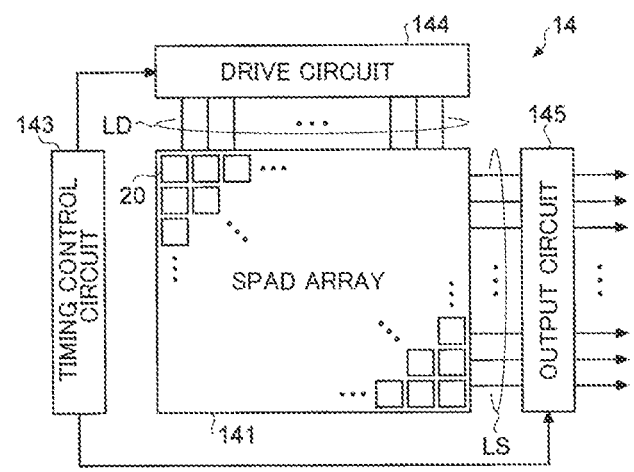
FIG. 3 is a block diagram showing an exemplary schematic configuration of a light receiving portion according to the first embodiment.

FIG. 3 is a block diagram showing an exemplary schematic configuration of the light receiving portion according to the first embodiment. As shown in FIG. 3, the light receiving portion 14 includes a SPAD array 141, a timing control circuit 143, a drive circuit 144, and an output circuit 145. In the following description, the timing control circuit 143, the drive circuit 144, and the output circuit 145 may be referred to as peripheral circuits.

The SPAD array 141 includes a plurality of SPAD pixels 20 arranged in a matrix. Pixel drive lines LD (extending in the vertical direction in the figure) are connected to the columns of the plurality of SPAD pixels 20 and output signal lines LS (extending in the horizontal direction in the figure) are connected to the rows. One ends of the pixel drive lines LD are connected to output ends of the drive circuit 144 corresponding to the columns and one ends of the output signal lines LS are connected to input ends of the output circuit 145 corresponding to the rows.

In the present embodiment, the whole or a part of the SPAD array 141 is used to detect the reflected light L2. The effective region 142 in the SPAD array 141 may be a vertically long rectangle similar to an image of the reflected light L2 formed on the SPAD array 141 when the laser light L1 is entirely reflected into the reflected light L2. However, the effective region 142 in the SPAD array 141 is not limited to this and various modifications can be made such as a region larger or smaller than the image of the reflected light L2 formed on the SPAD array 141.

The drive circuit 144 includes a shift register, an address decoder, and the like and drives the SPAD pixels 20 of the SPAD array 141 all at the same time, column by column, or the like. Thus, the drive circuit 144 includes at least a circuit that applies a quench voltage V_QCH which will be described later to each SPAD pixel 20 in a selected column of the SPAD array 141 and a circuit that applies a selection control voltage V_SEL which will be described later to each SPAD pixel 20 in the selected column. Then, the drive circuit 144 selects SPAD pixels 20 used to detect the incidence of photons column by column by applying the selection control voltage V_SEL to a pixel drive line LD corresponding to a column to be read.

Signals (referred to as detection signals) V_OUT output from the SPAD pixels 20 in the column selected and scanned by the drive circuit 144 are input to the output circuit 145 through the output signal lines LS. The output circuit 145 outputs the detection signals V_OUT input from the SPAD pixels 20 to a SPAD addition unit 40 provided for each macro pixel which will be described later.

The timing control circuit 143 includes a timing generator that generates various timing signals or the like and controls the drive and output circuits 144 and 145 based on the various timing signals generated by the timing generator.

1.4 SPAD Array

Figure 4:
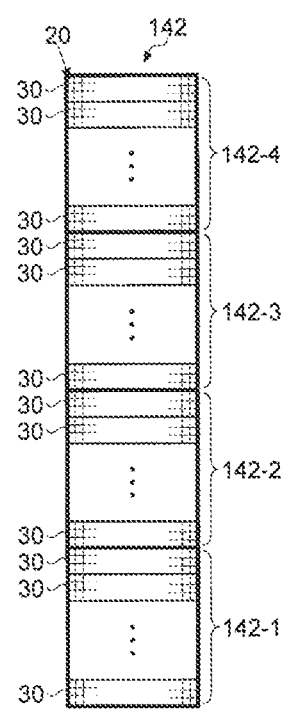
FIG. 4 is a schematic diagram showing an exemplary schematic configuration of an effective region in a SPAD array according to the first embodiment.

FIG. 4 is a schematic diagram showing an exemplary schematic configuration of the effective region in the SPAD array according to the first embodiment. As shown in FIG. 4, the effective region 142 has, for example, a configuration in which a plurality of SPAD pixels 20 are arranged in a matrix. The plurality of SPAD pixels 20 are grouped into a plurality of macro pixels 30, each composed of a predetermined number of SPAD pixels 20 arranged in rows and/or columns. A region defined by connecting outer edges of SPAD pixels 20 located on the outermost periphery of each macro pixel 30 has a predetermined shape (for example, a rectangle).

The effective region 142 is composed, for example, of a plurality of macro pixels 30 arranged in the vertical direction (corresponding to the column direction). In the present embodiment, the effective region 142 is divided, for example, into a plurality of regions (hereinafter referred to as SPAD regions) arranged in the vertical direction. In the example shown in FIG. 4, the effective region 142 is divided into four SPAD regions 142-1 to 142-4. The lowest located SPAD region 142-1 corresponds, for example, to the lowest quarter region in the angle of view SR of the effective region 142, the SPAD region 142-2 above it corresponds, for example, to the second lowest quarter region in the angle of view SR, the SPAD region 142-3 above it corresponds, for example, to the third lowest quarter region in the angle of view SR, and the highest SPAD region 142-4 corresponds, for example, to the highest quarter region in the angle of view SR.

1.5 SPAD Pixel

Figure 5:
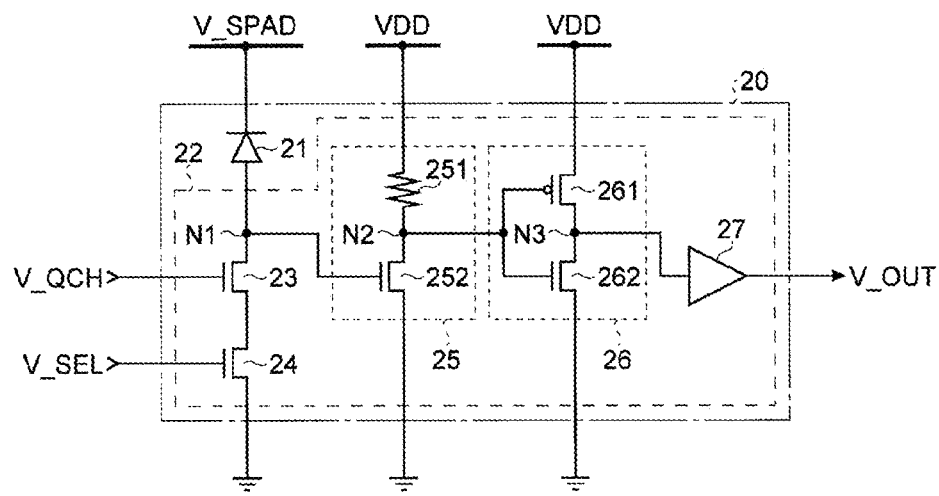
FIG. 5 is a circuit diagram showing an exemplary schematic configuration of a SPAD pixel according to the first embodiment.

FIG. 5 is a circuit diagram showing an exemplary schematic configuration of a SPAD pixel according to the first embodiment. As shown in FIG. 5, the SPAD pixel 20 includes a photoelectric conversion portion 21 which is a light receiving element and a reading circuit 22 for detecting that a photon is incident on the photoelectric conversion portion 21.

The reading circuit 22 includes a quench resistor 23, a digital converter 25, an inverter 26, a buffer 27, and a selection transistor 24. The quench resistor 23 is composed, for example, of an N-type metal oxide semiconductor field effect transistor (MOSFET) (hereinafter referred to as an NMOS transistor), a drain thereof is connected to an anode of the photoelectric conversion portion 21, and a source thereof is grounded via the selection transistor 24. Further, a preset quench voltage V_QCH for allowing the NMOS transistor to act as a quench resistor is applied to a gate of the NMOS transistor constituting the quench resistor 23 from the drive circuit 144 via a pixel drive line LD.

In the present embodiment, the photoelectric conversion portion 21 is a SPAD. The SPAD is an avalanche photodiode that operates in Geiger mode when a reverse bias voltage equal to or higher than the breakdown voltage is applied between an anode and a cathode thereof and can detect the incidence of a photon. That is, the photoelectric conversion portion 21 generates an avalanche current when a photon is incident while a reverse bias voltage V_SPAD equal to or higher than the breakdown voltage is being applied between the anode and cathode.

The digital converter 25 includes a resistor 251 and an NMOS transistor 252. A drain of the NMOS transistor 252 is connected to a power supply voltage VDD via the resistor 251 and a source thereof is grounded. The voltage at a connection point N1 between the anode of the photoelectric conversion portion 21 and the quench resistor 23 is applied to a gate of the NMOS transistor 252.

The inverter 26 includes a P-type MOSFET (hereinafter referred to as a PMOS transistor) 261 and an NMOS transistor 262. A drain of the PMOS transistor 261 is connected to the power supply voltage VDD and a source thereof is connected to a drain of the NMOS transistor 262. The drain of the NMOS transistor 262 is connected to the source of the PMOS transistor 261 and a source thereof is grounded. The voltage at a connection point N2 between the resistor 251 and the drain of the NMOS transistor 252 is applied to a gate of the PMOS transistor 261 and the gate of the NMOS transistor 262. An output of the inverter 26 is input to the buffer 27.

The buffer 27 is a circuit for impedance conversion. When an output signal is input to the buffer 27 from the inverter 26, the buffer 27 impedance-converts the input output signal and outputs the converted signal as a detection signal V_OUT.

The selection transistor 24 is, for example, an NMOS transistor, a drain thereof is connected to the source of the NMOS transistor constituting the quench resistor 23, and a source thereof is grounded. The selection transistor 24 is connected to the drive circuit 144. The selection transistor 24 changes from off to on when the selection control voltage V_SEL from the drive circuit 144 has been applied to a gate of the selection transistor 24 via the pixel drive line LD.

1.6 Exemplary Schematic Operation of SPAD Pixel

The reading circuit 22 illustrated in FIG. 5 operates, for example, as follows. First, while the selection control voltage V_SEL is applied from the drive circuit 144 to the selection transistor 24 such that the selection transistor 24 is on, a reverse bias voltage V_SPAD equal to or higher than the breakdown voltage is applied to the photoelectric conversion portion 21. This permits operation of the photoelectric conversion portion 21.

On the other hand, while the selection control voltage V_SEL is not applied from the drive circuit 144 to the selection transistor 24 such that the selection transistor 24 is off, the reverse bias voltage V_SPAD is not applied to the photoelectric conversion portion 21, thus prohibiting operation of the photoelectric conversion portion 21.

If a photon is incident on the photoelectric conversion portion 21 while the selection transistor 24 is on, an avalanche current is generated in the photoelectric conversion portion 21. Thus, an avalanche current flows through the quench resistor 23 and the voltage at the connection point N1 rises. When the voltage at the connection point N1 becomes higher than the turn-on voltage of the NMOS transistor 252, the NMOS transistor 252 is turned on and the voltage at the connection point N2 changes from the power supply voltage VDD to 0 V. Then, when the voltage at the connection point N2 has changed from the power supply voltage VDD to 0 V, the PMOS transistor 261 changes from off to on, the NMOS transistor 262 changes from on to off, and the voltage at a connection point N3 changes from 0 V to the power supply voltage VDD. As a result, a high-level detection signal V_OUT is output from the buffer 27.

Thereafter, when the voltage at the connection point N1 continues to rise, the voltage applied between the anode and cathode of the photoelectric conversion portion 21 becomes smaller than the breakdown voltage, whereby the avalanche current stops and the voltage at the connection point N1 drops. Then, when the voltage at the connection point N1 has become lower than the turn-on voltage of the NMOS transistor 452, the NMOS transistor 452 is turned off and the output of the detection signal V_OUT from the buffer 27 is stopped (becomes a low level).

In this way, the reading circuit 22 outputs a high-level detection signal V_OUT during a duration from the time when a photon is incident on the photoelectric conversion portion 21 and an avalanche current is generated such that the NMOS transistor 452 is turned on to the time when the avalanche current is stopped such that the NMOS transistor 452 is turned off. The output detection signal V_OUT is input to the SPAD addition unit 40 for each macro pixel 30 via the output circuit 145. Thus, the same number of detection signals V_OUT as the number of SPAD pixels 20 where the incidence of photons is detected among a plurality of SPAD pixels 20 constituting one macro pixel 30 (the number of detections) are input to each SPAD addition unit 40.

1.7 SPAD Addition Unit

Figure 6:
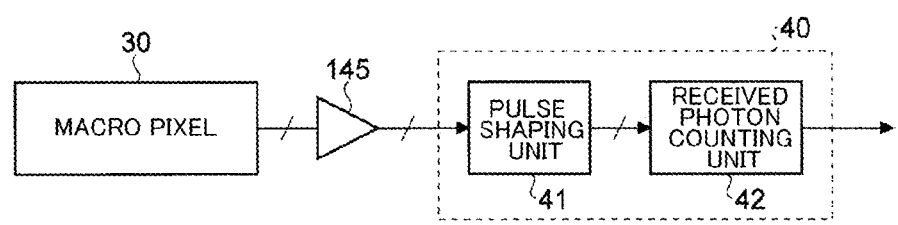
FIG. 6 is a block diagram showing an example of a more detailed configuration of a SPAD addition unit according to the first embodiment.

FIG. 6 is a block diagram showing an example of a more detailed configuration of the SPAD addition unit according to the first embodiment. The SPAD addition unit 40 may be configured to be included in the light receiving portion 14 or configured to be included in the calculation unit 15.

As shown in FIG. 6, the SPAD addition unit 40 includes, for example, a pulse shaping unit 41 and a received photon counting unit 42.

The pulse shaping unit 41 shapes the pulse waveform of detection signals V_OUT input from the SPAD array 141 via the output circuit 145 into a pulse waveform having a time width corresponding to the operating clock of the SPAD addition unit 40.

The received photon counting unit 42 counts detection signals V_OUT input from the corresponding macro pixel 30 for each sampling period, thereby counting the number of SPAD pixels 20 where the incidence of photons is detected (the number of detections) for each sampling period, and outputs this count value as a pixel value of the macro pixel 30.

1.8 Sampling Period

Here, the sampling period is the interval at which the time from the emission of the laser light L1 by the light emitting portion 13 to the detection of the incidence of a photon by the light receiving portion 14 (flight time) is measured. A period shorter than the light emission period of the light emitting portion 13 is set for this sampling period. For example, shortening the sampling period enables calculation of the flight time of a photon emitted from the light emitting portion 13 and reflected by the object 90 with a higher time resolution. This means that increasing the sampling frequency enables calculation of the distance to the object 90 with a higher distance measuring resolution.

For example, letting t be the flight time from when the laser light L1 is emitted by the light emitting portion 13, which is then reflected by the object 90, to when the reflected light L2 is incident on the light receiving portion 14, the distance L to the object 90 can be calculated by the following equation (1) since the speed of light C is constant (C≈300,000,000 meters/second (m/s)).

$$L = C \times t/2. \tag{1}$$

Therefore, when the sampling frequency is 1 GHz, the sampling period is 1 nanosecond (ns). In this case, one sampling period corresponds to 15 centimeters (cm). This indicates that the distance measuring resolution is 15 cm when the sampling frequency is 1 GHz. Further, when the sampling frequency is doubled to 2 GHz, the sampling period is 0.5 nanoseconds (ns), such that one sampling period corresponds to 7.5 centimeters (cm). This indicates that the distance measuring resolution can be halved when the sampling frequency is doubled. Thus, increasing the sampling frequency and shortening the sampling period enables calculation of the distance to the object 90 with higher accuracy.

1.9 Exemplary Chip Configuration

Figure 7:
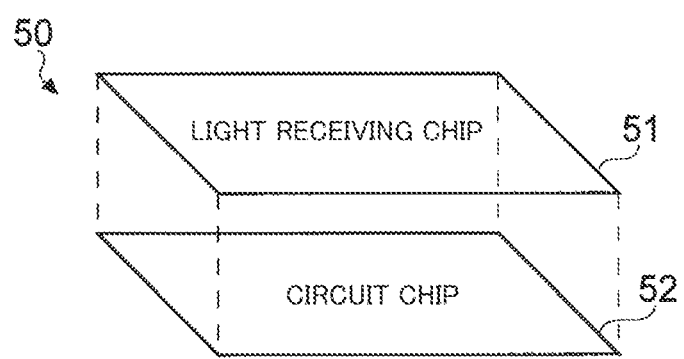
FIG. 7 is a diagram showing an exemplary chip configuration of the light receiving portion according to the first embodiment.

FIG. 7 is a diagram showing an exemplary chip configuration of the light receiving portion according to the first embodiment. As shown in FIG. 7, the ToF sensor 1 has, for example, a structure of a bonded chip 50 in which a first chip 51 and a second chip 52 are vertically bonded together. The first chip 51 is, for example, a semiconductor chip in which the photoelectric conversion portions 21 of the SPAD pixels 20 are arranged in a matrix and the second chip 52 is, for example, a semiconductor chip in which the reading circuits 22 of the SPAD pixels 20, the peripheral circuits, and the like are formed.

For example, so-called direct bonding in which bonding surfaces of the first and second chips 51 and 52 are flattened and the first and second chips 51 and 52 are bonded together by intermolecular force can be used to bond the first and second chips 51 and 52 together. However, the present disclosure is not limited to this, and for example, so-called Cu—Cu bonding in which electrode pads made of copper (Cu) formed on the bonding surfaces of the first and second chips 51 and 52 are bonded together, other bump bonding, or the like can be used.

The first and second chips 51 and 52 are electrically connected, for example, via a connecting portion such as a through-silicon via (TSV) penetrating the semiconductor substrate. For example, a so-called twin TSV method in which two TSVs, a TSV provided on the first chip 51 and a TSV provided from the first chip 51 to the second chip 52, are connected on outer surfaces of the chips, a so-called shared TSV method in which the first and second chips 51 and 52 are connected by a TSV penetrating from the first chip 51 to the second chip 52, or the like can be adopted for the connection using TSVs.

However, the first and second chips 51 and 52 are electrically connected via a Cu—Cu bonding portion or a bump bonding portion when Cu—Cu bonding or bump bonding is used to bond the first and second chips 51 and 52 together.

The bonded chip 50 shown in FIG. 7 may include the calculation unit 15, the light emitting portion 13, the controller 11, and the like in addition to the light receiving portion 14.

1.10 Exemplary Cross-Sectional Structure

Figure 8:
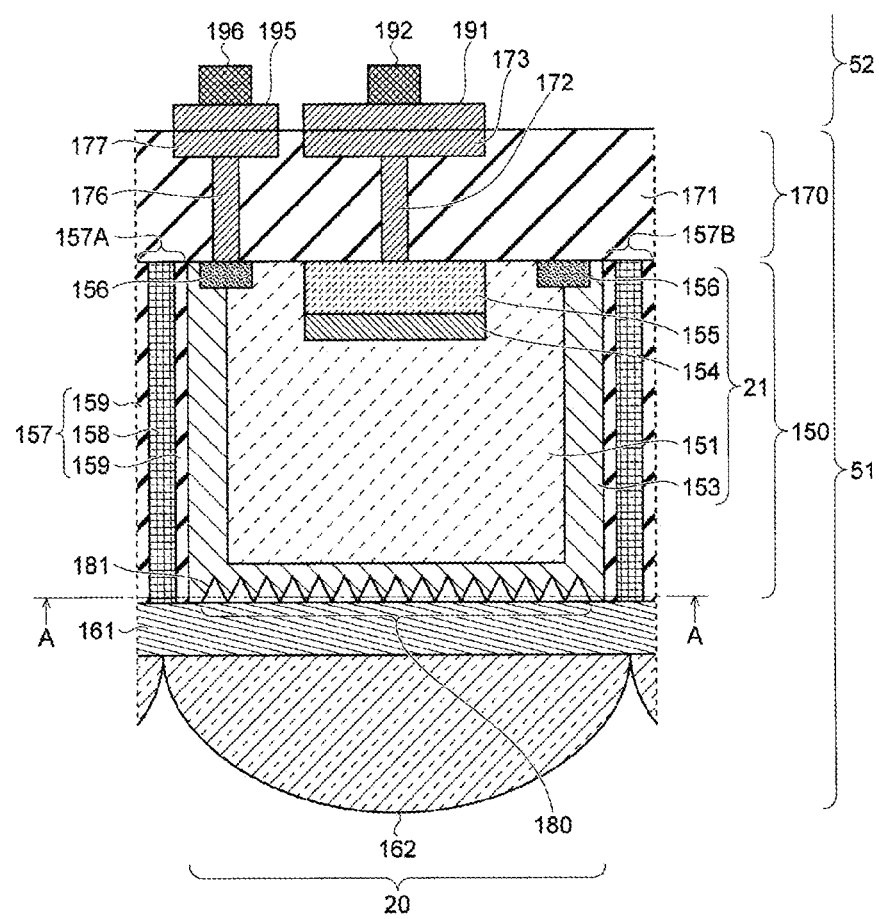
FIG. 8 is a cross-sectional view showing an exemplary cross-sectional structure of a first chip according to the first embodiment.
Figure 9:
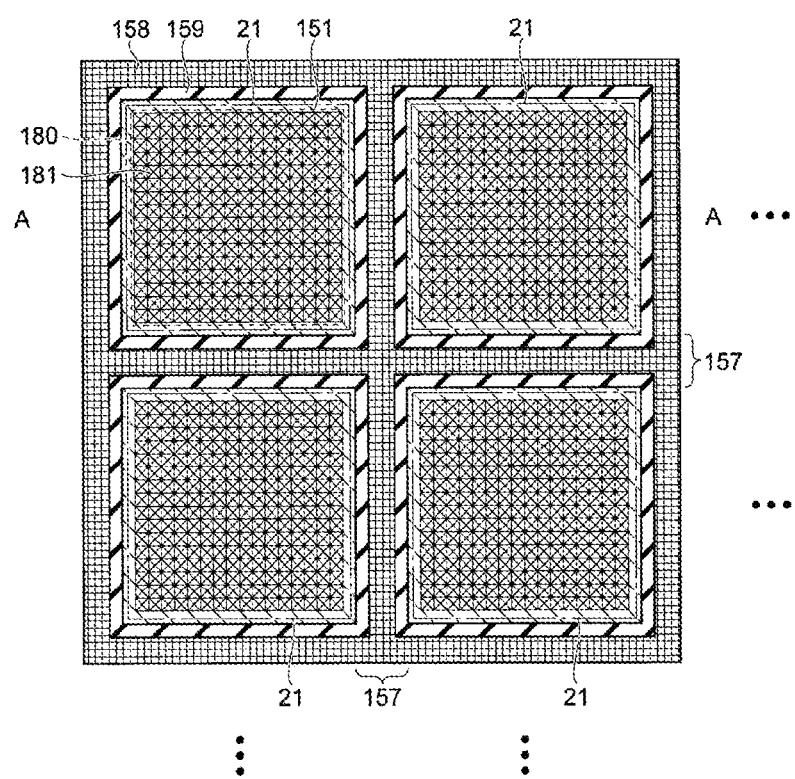
FIG. 9 is a cross-sectional view showing a cross-sectional structure of plane A-A in FIG. 8.

FIG. 8 is a cross-sectional view showing an exemplary cross-sectional structure of the first chip according to the first embodiment. FIG. 9 is a cross-sectional view showing a cross-sectional structure of plane A-A in FIG. 8. FIG. 8 shows an exemplary cross-sectional structure of a photoelectric conversion portion 21 in one SPAD pixel 20. However, in reality, photoelectric conversion portions 21 having the cross-sectional structure illustrated in FIG. 8 are arranged on the first chip 51 in a matrix as shown in FIG. 9. In FIG. 8, a lower surface of the first chip 51 is a light incident surface.

As shown in FIG. 8, the first chip 51 includes a semiconductor substrate 150, a wiring layer 170, a flattening film 161, and an on-chip lens 162.

The semiconductor substrate 150 may be a semiconductor substrate made of a semiconductor material or a compound semiconductor material such as silicon (Si), germanium (Ge), gallium arsenide (GaAs), indium gallium arsenide (InGaAs), gallium phosphide (GaP), or indium phosphide (InP).

A photoelectric conversion portion 21 including an N− type semiconductor region 151, a P− type semiconductor region 153, a P+ type semiconductor region 154, and a contact layer 156 is formed in the semiconductor substrate 150.

The N− type semiconductor region 151 is, for example, a well region and may be a region containing a low concentration of donors. The N− type semiconductor region 151 may be, for example, a rectangular parallelepiped region having a square or rectangular cross-section parallel to an inside surface of the semiconductor substrate 150.

The P-type semiconductor region 153 is, for example, a region containing a predetermined concentration of acceptors and may be a region surrounding at least side and bottom surfaces of the N− type semiconductor region 151.

The N+ type semiconductor region 155 is, for example, a region containing a high concentration of donors and is arranged on the outside surface of the semiconductor substrate 150. The P+ type semiconductor region 154 is, for example, a region containing a higher concentration of acceptors than the P− type semiconductor region 153 and is arranged near the outside surface of the semiconductor substrate 150 such that the P+ type semiconductor region 154 contacts the N+ type semiconductor region 155.

The P+ type semiconductor region 154 and the N+ type semiconductor region 155 form a PN junction that generates an avalanche current. Thus, an electric charge generated by photoelectric conversion in the N− type semiconductor region 151 is introduced into the P+ type semiconductor region 154 and is then amplified (avalanche-amplified) due to a relatively large potential difference given between the P+ type semiconductor region 154 and the N+ type semiconductor region 155.

The N+ type semiconductor region 155 also functions as a cathode of the photoelectric conversion portion 21 and serves as a contact layer for extracting the generated avalanche current out of the semiconductor substrate 150. On the other hand, the contact layer 156 is formed in a region of the P− type semiconductor region 153 which is on the outside surface of the semiconductor substrate 150 and separated from the N+ type semiconductor region 155. The contact layer 156 is, for example, a P++ type region containing a high concentration of acceptors and also functions as an anode of the photoelectric conversion portion 21. For example, when the outside surface of the semiconductor substrate 150 on which the contact layer 156 is formed is viewed in plain view (see, for example, FIG. 9 which will be described later), the contact layer 156 is formed along inner and outer peripheries of an area surrounded by an element separation portion 157 on the outside surface of the semiconductor substrate 150. When viewed in the cross-sectional structure in which the element separation portion 157 is viewed as being divided into two left and right regions (which will be referred to as element separation regions) 157A and 157B as shown in FIG. 8, the contact layer 156 is formed in two regions in a region defined by the two left and right element separation regions 157A and 157B, the two regions being on the outside surface side of the semiconductor substrate 150 and close to the element separation regions 157A and 157B, respectively.

The N+ type semiconductor region 155 can also function as an anode of the photoelectric conversion portion 21. In this case, the contact layer 156 functions as a cathode of the photoelectric conversion portion 21.

The photoelectric conversion portions 21 having the above configuration are defined by the element separation portions 157 as described above. For example, the element separation portions 157 are provided in trenches formed in a grid pattern when viewed from the outside or inside surface side of the semiconductor substrate 150 as shown in FIGS. 8 and 9.

Each element separation portion 157 includes, for example, insulating films 159 covering inner side surfaces of a trench formed in the semiconductor substrate 150 and a reflective film 158 embedded in the trench with the insulating films 159 formed on the inner side surfaces. Here, it is not essential that the reflective film 158 is fully embedded in the trench and a void may remain in a part of the trench.

The reflective film 158 is, for example, a film for reflecting light incident on the element separation portion 157. For example, not only a reflective material that reflects visible light, infrared light, or the like such as tungsten (W), but also a high refractive index material such as silicon (Si), germanium (Ge), gallium phosphide (GaP), aluminum oxide ($Al_2O_3$), cerium oxide ($CeO_2$), hafnium oxide ($HfO_2$), indium oxide ($In_2O_3$), tin oxide ($SnO_2$), niobium pentoxide (Nb2O5), magnesium oxide (MgO), tantalum pentoxide ($Ta_2O_5$), titanium pentoxide ($Ti_3O_5$), other titanium oxide (such as TiO or $TiO_2$), tungsten oxide ($WO_3$), yttrium oxide ($Y_2O_3$), zinc oxide (ZnO), zirconia ($ZrO_2$), cerium fluoride ($CeF_3$), gadolinium fluoride ($GdF_3$), lanthanum fluoride ($LaF_3$), or neodymium fluoride ($NdF_3$) can be used for the reflective film 158. The high refractive index material may be a material having a higher refractive index than the substrate material of the semiconductor substrate 150.

The insulating films 159 are, for example, films for preventing electrical contact between the semiconductor substrate 150 and the reflective film 158. For example, an insulating material such as silicon oxide ($SiO_2$) or silicon nitride (SiN) can be used for the insulating films 159. However, the insulating films 159 may be omitted when an insulating material is used for the reflective film 158.

By optically separating adjacent SPAD pixels 20 by the element separation portions 157 in this way, the leakage of light into adjacent SPAD pixels 20 can be reduced, such that color mixture between adjacent pixels can be limited.

FIG. 8 illustrates a so-called front full trench isolation (FFTI) type element separation portion 157 that penetrates from the outside surface to the inside surface of the semiconductor substrate 150. However, the configuration of the element separation portion 157 is not limited to the FFTI type. For example, various modifications can be made such as a so-called deep trench isolation (DTI) type element separation portion present from the outside surface to the middle of the semiconductor substrate 150 or a so-called reverse deep trench isolation (RDTI) type element separation portion present from the inside surface to the middle of the semiconductor substrate 150.

Further, a plurality of regularly or randomly arranged concave-convex portions 181 are provided on the inside surface of the semiconductor substrate 150 over the entirety of each of the regions 180 defined by the element separation portions 157, that is, over an effective light incident surface of the semiconductor substrate 150 as shown in FIGS. 8 and 9.

The individual concave-convex portions 181 may have various shapes such as, for example, a polygonal prism such as a quadrangular prism, a triangular prism, or a hexagonal prism, a polygonal pyramid such as a quadrangular pyramid, a triangular pyramid, or a hexagonal pyramid, a polygonal frustum such as a quadrangular frustum, a triangular frustum, or a hexagonal frustum, a cone (including an elliptical cone), or a truncated cone. For example, the change in the refractive index along the traveling direction of light can be made more gradual by forming the shape such that the diameter decreases toward the tip. The shape also includes a shape with a tip at an obtuse angle or a shape with a flat tip (such as a truncated frustum or a truncated cone).

The inside of the concave-convex portion 181 may be filled with an insulating film such as silicon oxide ($SiO_2$) or silicon nitride (SiN). The size of each concave-convex portion 181 can be variously modified as long as it is a size that can reduce the reflectance of the inside surface of the semiconductor substrate 150, such as several micrometers (μm) or several nanometers (nm).

By forming the inside surface of the semiconductor substrate 150 with a moth-eye structure including a plurality of concave-convex portions 181 in this way, it is possible to reduce the reflectance on the inside surface of the semiconductor substrate 150. Thereby, it is possible to increase the efficiency of the incidence of light on the photoelectric conversion portion 21, and as a result, it is possible to increase the quantum efficiency of the photoelectric conversion portion 21.

Further, by combining the reflective film 158 in the element separation portion 157 and the moth-eye structure, light scattered or diffracted by the moth-eye structure can be reflected by the reflective film 158. Thereby, it is possible to lengthen the flight distance of light incident on the semiconductor substrate 150 within the photoelectric conversion portion 21, and as a result, it is possible to increase the quantum efficiency of the photoelectric conversion portion 21.

The on-chip lens 162 is provided on the inside surface of the semiconductor substrate 150 via the flattening film 161 made of a silicon oxide film, a silicon nitride film, or the like. The flattening film 161 may include a pinning layer or the like provided at a boundary with the semiconductor substrate 151. An outside surface of the on-chip lens 162 is given, for example, a curvature that allows the incident light to be focused near the center of the photoelectric conversion portion 21.

On the other hand, the wiring layer 170 described above is provided on the outside surface side of the semiconductor substrate 150. The wiring layer 170 includes an insulating film 171 such as a silicon oxide film or a silicon nitride film. For example, a via wiring 172 in contact with the N+ type semiconductor region 155 that also functions as the cathode of the photoelectric conversion portion 21 and a via wiring 176 in contact with the contact layer 156 that also functions as the anode of the photoelectric conversion portion 21 are provided in the insulating film 171.

Further, for example, an electrode pad 173 made of copper (Cu) in contact with the via wiring 172 and an electrode pad 177 made of copper (Cu) in contact with the via wiring 176 are provided on an outside surface of the insulating film 171 (a surface opposite to the semiconductor substrate 150). These electrode pads 173 and 177 are used as electrode pads when the first and second chips 51 and 52 are Cu—Cu bonded. Thus, when the first and second chips 51 and 52 are electrically and mechanically bonded in another bonding form, the electrode pads 173 and 177 may be replaced with members used for the bonding.

Although detailed illustration of the second chip 52 is omitted, FIG. 8 shows electrode pads 191 and 195 made of copper (Cu) used for Cu—Cu bonding, a terminal 192 that applies an electric potential (for example, +3 volts (V)) to the cathode of the photoelectric conversion portion 21, and a terminal 196 that applies an electric potential (for example, −20 volts (V)) to the anode.

For example, when +3 volts (V) is applied to the cathode (the N+ type semiconductor region 155) of the photoelectric conversion portion 21 via the terminal 192 and −20 V is applied to the anode (the contact layer 156) via the terminal 196, theoretically, a reverse bias voltage V_SPAD of 23 V is applied between the N+ type semiconductor region 155 and the P+ type semiconductor region 154. Since this reverse bias voltage V_SPAD is a potential difference equal to or greater than the breakdown voltage of the N+ type semiconductor region 155 and the P+ type semiconductor region 154, an electric charge generated by photoelectric conversion moves due to an electric field formed in the N− type semiconductor region 151 and is introduced into the P+ type semiconductor region 154, such that an avalanche current is generated in the PN junction region composed of the N+ type semiconductor region 155 and the P+ type semiconductor region 154. This avalanche current is input to the reading circuit 22 via the terminal 192.

P and N types may be interchanged in the configuration described above. In this case, the N− type semiconductor region 151 is replaced with a P− type semiconductor region, the P− type semiconductor region 153 is replaced with an N− type semiconductor region, the P+ type semiconductor region 154 is replaced with an N+ type semiconductor region, and the N+ type semiconductor region 155 is replaced with a P+ type semiconductor region. Further, the contact layer 156 is replaced with an N++ type region.

1.11 Moth-Eye Structure

Here, the moth-eye structure will be described with reference to FIG. 10. The moth-eye structure is a region in which fine concave-convex portions 181 are formed. However, the concavity and convexity change depending on where a surface used as a reference (hereinafter referred to as a reference surface) is set.

The moth-eye structure is a region having a fine concave-convex structure formed at the interface (the interface on the light receiving surface side) of the P-type semiconductor region 153 above the N− type semiconductor region 151 which is the charge storage region. This concave-convex structure is formed on the N− type semiconductor region 151, that is, on the light receiving surface side of the semiconductor substrate 150. Therefore, the reference surface can be a predetermined surface of the semiconductor substrate 150. This description will continue with reference to the case where a part of the semiconductor substrate 150 is used as a reference surface as an example.

Figure 10:
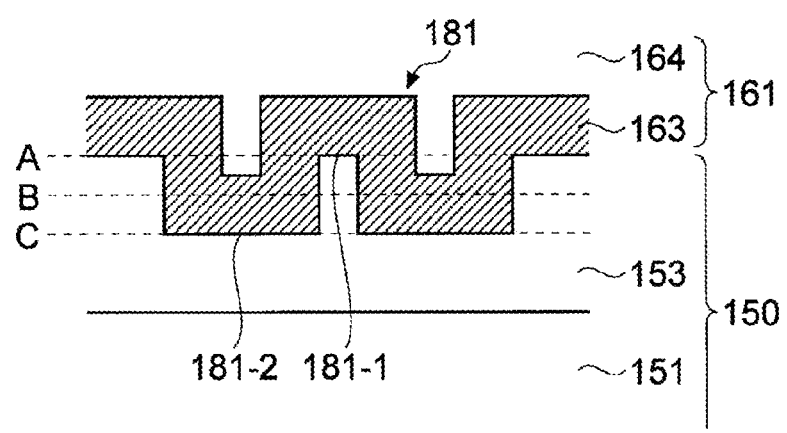
FIG. 10 is a diagram for explaining an example of a moth-eye structure according to the first embodiment.

FIG. 10 is an enlarged view of the vicinity of concave-convex portions 181. The case where the flattening film 161 includes a pinning layer 163 as its bottom layer (on the semiconductor substrate 150 side) and a transparent insulating film 164 above the pinning layer 163 will be illustrated in this description.

In the example shown in FIG. 10, it is assumed that boundary surfaces of the concave-convex portions 181 between the pinning layer 163 and the transparent insulating film 164 are upper surfaces 181-1. Further, boundary surfaces between the pinning layer 163 and the semiconductor substrate 150 are lower surfaces 181-2.

Further, it is assumed that reference surface A is a surface at the position where the upper surfaces 181-1 are formed and reference surface C is a surface at the position where the lower surfaces 181-2 are formed. It is assumed that reference surface B is a surface located between the reference surface A and the reference surface C, that is, a surface located between the upper surfaces 181-1 and the lower surfaces 181-2.

When the reference surface A is used as a reference, the shapes of the concave-convex portions 181 are concave shapes with respect to the reference surface A. That is, when the reference surface A is used as a reference, the lower surfaces 181-2 are located at a position recessed below the reference surface A (=upper surface 181-1) and the concave-convex portions 181 are regions where fine concavities are formed. In other words, when the reference surface A is used as a reference, a concavity is formed between an upper surface 181-1 and an upper surface 181-1 and thus the concave-convex portions 181 can be said to be regions in which fine concavities are formed.

When the reference surface C is used as a reference, the shapes of the concave-convex portions 181 are convex shapes with respect to the reference surface C. That is, when the reference surface C is used as a reference, the upper surfaces 181-1 are located at a position protruding above the reference surface C (=lower surface 181-2) and the concave-convex portions 181 are regions where fine convexities are formed. In other words, when the reference surface C is used as a reference, a convexity is formed between a lower surface 181-2 and a lower surface 181-2 and thus the concave-convex portions 181 can be said to be regions in which fine convexities are formed.

When the reference surface B is used as a reference, the shapes of the concave-convex portions 181 are concave and convex shapes with respect to the reference surface B. That is, when the reference surface B is used as a reference, the lower surfaces 181-2 are located at a position recessed below the reference surface B (=surface located midway between upper surfaces 181-1 and lower surfaces 181-2) and thus the concave-convex portions 181 can be said to be regions where fine concavities are formed.

Further, when the reference surface B is used as a reference, the upper surfaces 181-1 are located at a position protruding above the reference surface B and thus the concave-convex portions 181 can be said to be regions in which fine convexities are formed.

The moth-eye structure can be expressed as a region formed with fine concavities, a region formed with fine convexities, or a region formed with fine concavities and convexities depending on where the reference surface is set in the cross-sectional view of the SPAD pixel 20 as described above.

In the following description, the concave-convex portions 181 will be described with reference to the case where the reference surface A, that is, the upper surface 181-1, is used as a reference surface as an example, and the description will continue assuming that the concave-convex portions 181 are regions in which fine concavities are formed.

The pitch of concavities corresponding to the period of concavities in the concave-convex portions 181 is set, for example, to 250 nm or more.

Figure 11:
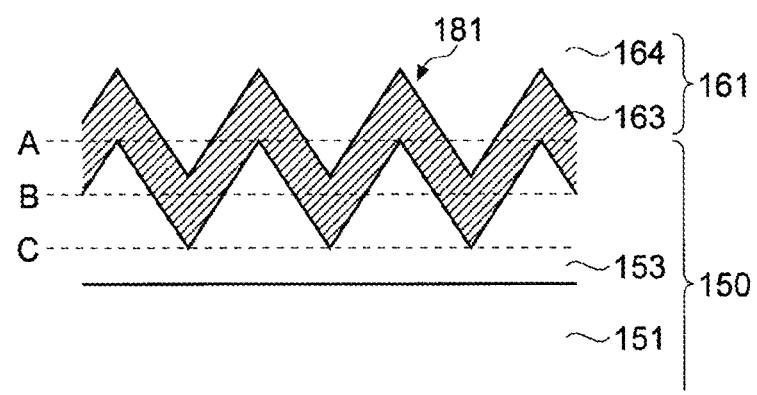
FIG. 11 is a diagram for explaining another example of the moth-eye structure according to the first embodiment.

In the example shown in FIG. 10, the case where the concave-convex portions 181 have a shape combining the planes of the upper surface 181-1 and the lower surface 181-2 is shown as an example, but the concave-convex portions 181 to which the present technology is applied also include those having a shape as shown in FIG. 11.

Concave-convex portions 181 shown in FIG. 11 are formed in the shape of triangles in a cross-sectional view. Even with such a shape, a reference surface can be set and a concavity or a convexity can be defined with respect to the reference surface.

Since the concave-convex portions 181 shown in FIG. 11 are formed in the shape of triangles in a cross-sectional view, a surface connecting vertices thereof is set as a reference surface as an example of the reference surface.

A surface including a line connecting vertices on the transparent insulating film 164 side among the vertices of the triangles of the concave-convex portions 181 in the cross-sectional view is defined as reference surface A. A surface including a line connecting vertices on the bottom side, that is, vertices on the N– type semiconductor region 151 side, among the vertices of the triangles of the concave-convex portions 181 is defined as reference surface C. A surface between the reference surface A and the reference surface C is defined as reference surface B.

Even when a reference surface is set at the positions of vertices of the triangles of the concave-convex portions 181 as described above, the shape of the concave-convex portions 181 can be expressed differently depending on where the reference surface is set, similar to the case described with reference to FIG. 10.

That is, when the reference surface A is used as a reference, the shapes of the concave-convex portions 181 are shapes having triangular (valley-like) concavities facing downward from the reference surface A. That is, when the reference surface A is used as a reference, valley regions are located below the reference surface A and the valley regions correspond to concavities and therefore the concave-convex portions 181 are regions in which fine concavities are formed. In other words, when the reference surface A is used as a reference, a concavity is formed between the vertex of a triangle and the vertex of an adjacent triangle and thus the concave-convex portions 181 can be said to be regions in which fine concavities are formed.

When the reference surface C is used as a reference, the shapes of the concave-convex portions 181 are shapes having triangular (peaked) convexities facing upward from the reference surface C. That is, when the reference surface C is used as a reference, peak regions are located above the reference surface C and the peak regions correspond to convexities and therefore the concave-convex portions 181 are regions in which fine convexities are formed. In other words, when the reference surface C is used as a reference, a convexity is formed between the vertices of the base of a triangle and thus the concave-convex portions 181 can be said to be regions in which fine heads are formed.

When the reference surface B is used as a reference, the shapes of the concave-convex portions 181 are shapes having concavities and convexities (valleys and peaks) with respect to the reference surface B. That is, when the reference surface B is used as a reference, the concave-convex portions 181 can be said to be regions formed with fine concavities and convexities because they have concavities forming valleys below the reference surface B and convexities forming peaks above the reference surface B.

Even when the shapes of the concave-convex portions 181 are zigzag shapes having peaks and valleys as shown in FIG. 11, the concave-convex portions 181 can be defined as regions that can be expressed as regions formed with fine concavities, regions formed with fine convexities, or regions formed with fine concavities and convexities depending on where the reference surface is set in the cross-sectional view of the SPAD pixel 20 as described above.

Further, for example, when the reference surface is the interface between a layer above the transparent insulating film 164 in the flattening film 161 and the transparent insulating film 164 in the concave-convex portions 181 shown in FIG. 10 or 11, the concave-convex portions 181 can be said to be regions formed with fine concavities since the shapes of the concave-convex portions 181 have recessed regions (valleys).

Further, when the reference surface is the boundary surface between the P-type semiconductor region 153 and the N– type semiconductor region 151, the concave-convex portions 181 can be said to be regions formed with fine convexities since the shapes of the concave-convex portions 181 have protruding regions (peaks).

With a predetermined flat surface in the cross-sectional view of the SPAD pixel 20 used as a reference surface, the shapes of the concave-convex portions 181 can also be expressed depending on whether they are formed in the shape of valleys or formed in the shape of peaks with respect to the reference surface as described above.

Further, a region between SPAD pixels 20, that is, a region corresponding to the element separation portions 157 can be formed as a flat region in which no concave-convex portions 181 are formed. In this case, a surface including this flat region may be used as a reference surface.

When the surface including the flat region is used as a reference surface, the concave-convex portions 181 can be said to be regions in which fine concavities are formed since the shapes of the concave-convex portions 181 can be said to be shapes having portions recessed below the reference surface, that is, having valley-like portions.

The concave-convex portions 181 are regions that can be expressed as regions formed with fine concavities, regions formed with fine convexities, or regions formed with fine concavities and convexities depending on where the reference surface is set in the cross-sectional view of the SPAD pixel 20 as described above.

Further, the concave-convex portions 181 can be expressed as forming regions formed with fine concavities, forming regions formed with fine convexities, or forming regions formed with fine concavities depending on the method of forming the concave-convex portions 181.

For example, in the case where the concave-convex portions 181 shown in FIG. 10 are formed so as to have shapes with the upper surfaces 181-1 formed larger than the lower surfaces 181-2, it can be said that portions corresponding to concavities are formed by scraping the substrate (the semiconductor substrate 150) while portions corresponding to convexities are left.

When the amount of the substrate scraped exceeds 50%, the amount of the substrate (silicon) scraped is larger than the amount of the substrate left such that concavities and convexities are formed with the area of the concavities larger than the area of the convexities. That is, in this forming method, concavities and convexities are formed such that concavities are dominant and thus it can be expressed that the concave-convex portions 181 are formed by providing a plurality of convexities.

Further, when the amount of the substrate scraped is 50% or less, the amount of the substrate (silicon) scraped is smaller than the amount of the substrate left such that concavities and convexities are formed with the area of the concavities smaller than the area of the convexities. That is, in this forming method, concavities and convexities are formed such that convexities are dominant and thus it can be expressed that the concave-convex portions 181 are formed by providing a plurality of concavities.

From these facts, it can be expressed that a plurality of convexities are provided when concavities are dominant and it can be expressed that a plurality of concavities are provided when the substrate is dominant, depending on the method of forming the concave-convex portions 181.

The concave-convex portions 181 are regions that can be expressed as regions formed with fine concavities, regions formed with fine convexities, or regions formed with fine concavities and convexities in the cross-sectional view of the SPAD pixel 20, depending on the method of forming the concave-convex portions 181 as described above.

Although the following description will continue assuming that the concave-convex portions 181 are regions formed with fine concavities, this expression also includes regions such as regions formed with fine convexities or regions formed with fine concavities and convexities as described above.

1.12 Operation and Advantages

By providing the above configuration according to the present embodiment, it is possible to reduce the reflectance on the inside surface of the semiconductor substrate 150. Thereby, it is possible to increase the efficiency of the incidence of light on the photoelectric conversion portion 21, and as a result, it is possible to increase the quantum efficiency of the photoelectric conversion portion 21.

Further, by combining the reflective film 158 in the element separation portion 157 and the moth-eye structure, light scattered or diffracted by the moth-eye structure can be reflected by the reflective film 158 such that it is possible to lengthen the flight distance, and as a result, it is possible to increase the quantum efficiency of the photoelectric conversion portion 21.

1.13 Modifications

The case where the entire effective light incident surface (region 180) on the inside surface of the semiconductor substrate 150 is provided with the concave-convex portions 181 to form a moth-eye structure is illustrated in the first embodiment described above. However, the region in which the concave-convex portions 181 are formed is not limited to the entire effective light incident surface (region 180) on the inside surface of the semiconductor substrate 150. Thus, modifications of the region 180 in which the concave-convex portions 181 are formed will be described below with reference to some examples.

1.13.1 First Modification

Figure 12:
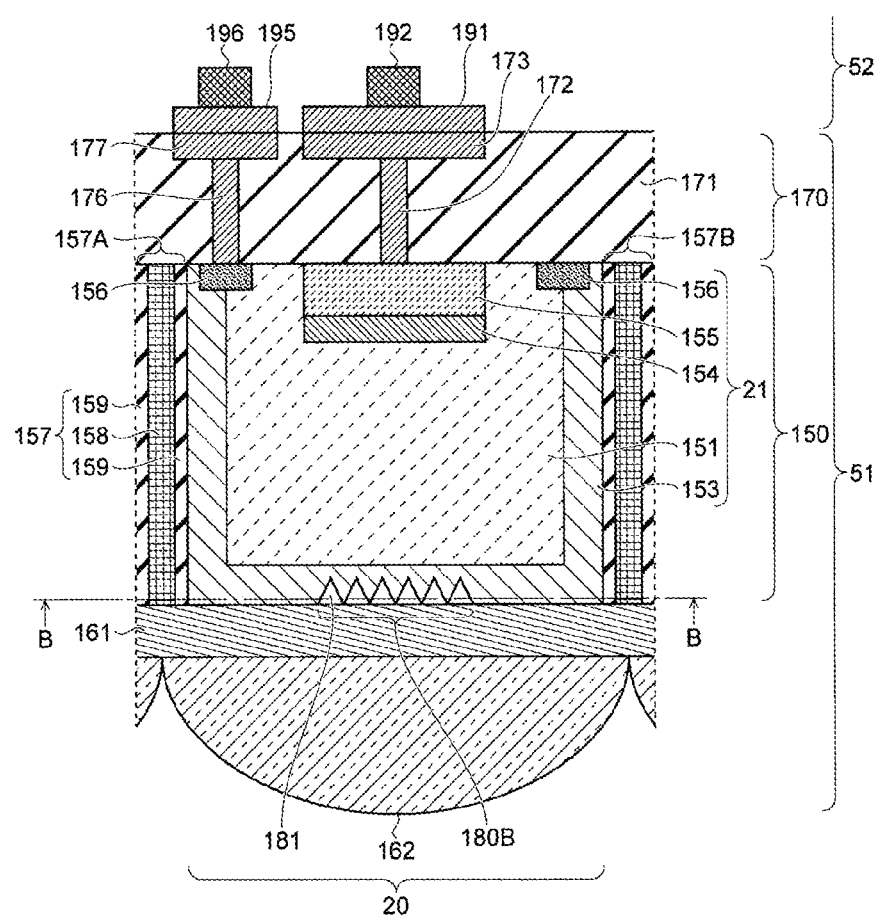
FIG. 12 is a cross-sectional view showing an exemplary cross-sectional structure of a first chip according to a first modification of the first embodiment.
Figure 13:
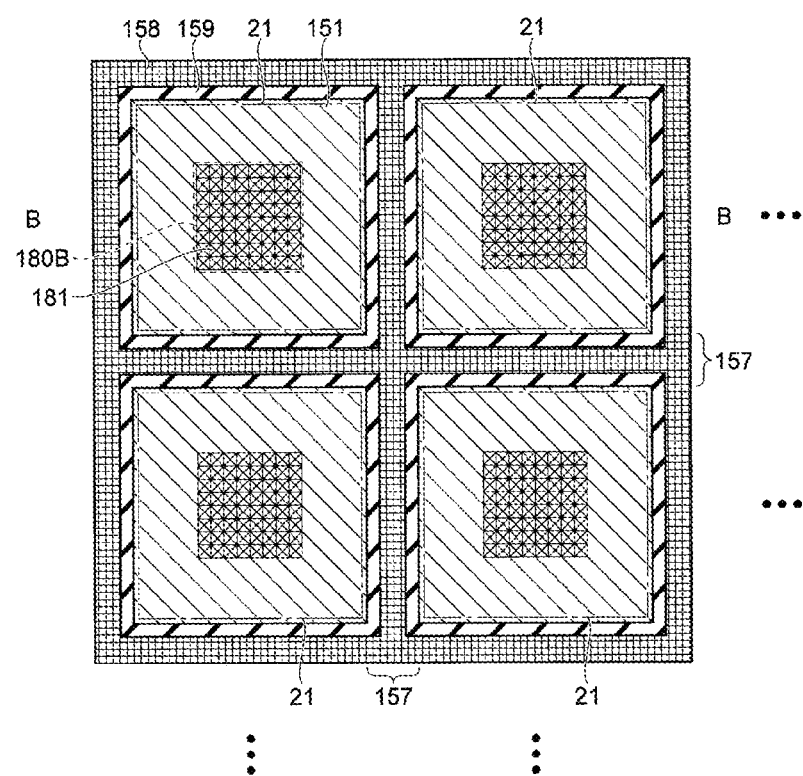
FIG. 13 is a cross-sectional view showing a cross-sectional structure of plane B-B in FIG. 12.

FIG. 12 is a cross-sectional view showing an exemplary cross-sectional structure of a first chip according to a first modification. FIG. 13 is a cross-sectional view showing a cross-sectional structure of plane B-B in FIG. 12. Similar to FIG. 8, FIG. 12 shows an exemplary cross-sectional structure of a photoelectric conversion portion 21 in one SPAD pixel 20. However, in reality, photoelectric conversion portions 21 having the cross-sectional structure illustrated in FIG. 12 are arranged on the first chip 51 in a matrix as shown in FIG. 13. In FIG. 12, a lower surface of the first chip 51 is a light incident surface.

As shown in FIGS. 12 and 13, a region 180B in which concave-convex portions 181 are formed may be a region located at a central portion in a region (hereinafter referred to as a pixel region) defined by the element separation portion 157 on the inside surface of the semiconductor substrate 150, for example, above the N+ type semiconductor region 155 and the P+ type semiconductor region 154. In other words, a region (flat portion) in which no concave-convex portions 181 are formed may be present on the outer periphery of the pixel region, for example, above the contact layer 156. "Above" in this description may be that when upward is defined as the direction from the inside surface to the outside surface of the semiconductor substrate 150 which is parallel to the substrate thickness direction of the semiconductor substrate 150.

1.13.2 Second Modification

Figure 14:
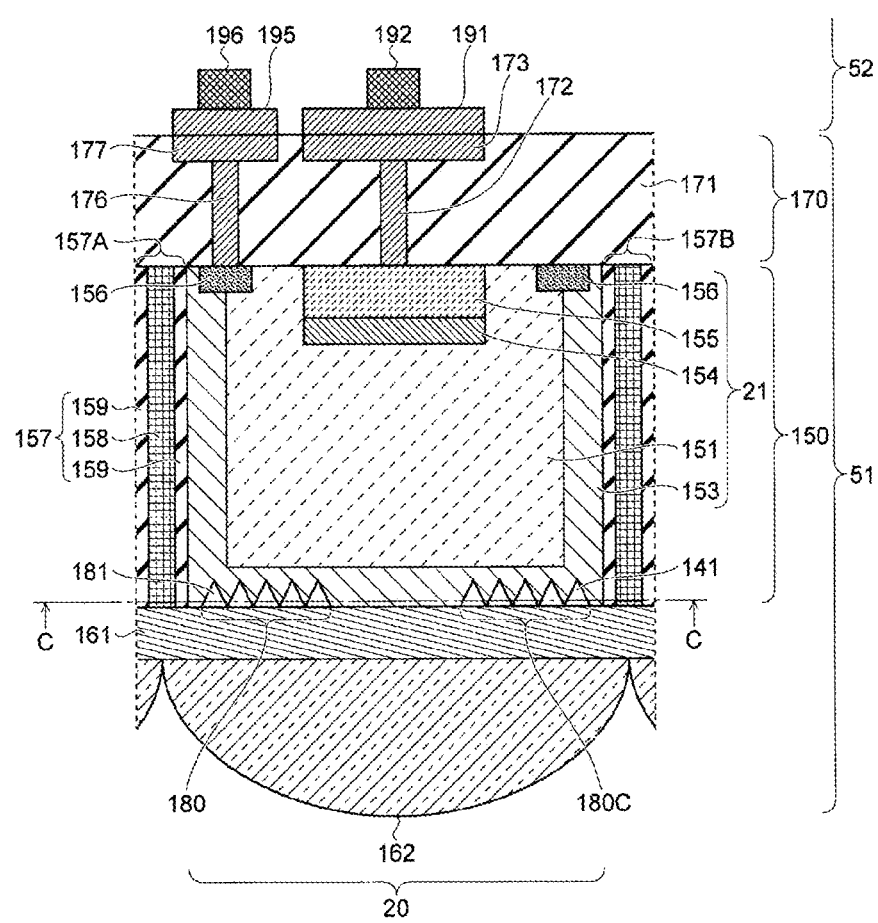
FIG. 14 is a cross-sectional view showing an exemplary cross-sectional structure of a first chip according to a second modification of the first embodiment.
Figure 15:
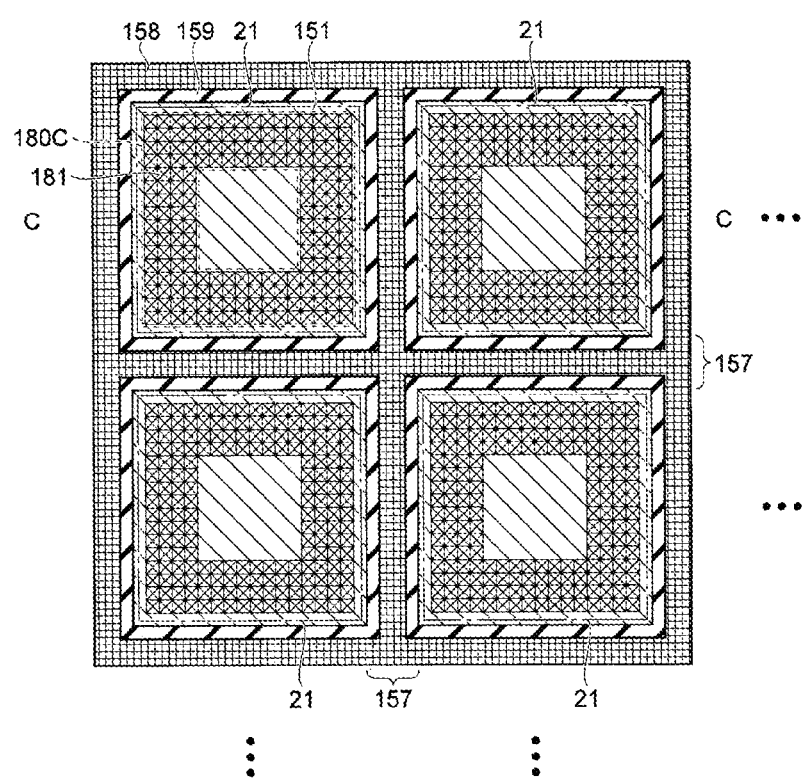
FIG. 15 is a cross-sectional view showing a cross-sectional structure of plane C-C in FIG. 14.

FIG. 14 is a cross-sectional view showing an exemplary cross-sectional structure of a first chip according to a second modification. FIG. 15 is a cross-sectional view showing a cross-sectional structure of plane C-C in FIG. 14. Similar to FIG. 8, FIG. 14 shows an exemplary cross-sectional structure of a photoelectric conversion portion 21 in one SPAD pixel 20. However, in reality, photoelectric conversion portions 21 having the cross-sectional structure illustrated in FIG. 14 are arranged on the first chip 51 in a matrix as shown in FIG. 15. In FIG. 14, a lower surface of the first chip 51 is a light incident surface.

As shown in FIGS. 14 and 15, a region 180C in which concave-convex portions 181 are formed may be a region located at an outer peripheral portion in the pixel region, for example, above the contact layer 156. In other words, a region (flat portion) in which no concave-convex portions 181 are formed may be present in the center of the pixel region, for example, above the N+ type semiconductor region 155 and the P+ type semiconductor region 154.

1.13.3 Third Modification

Figure 16:
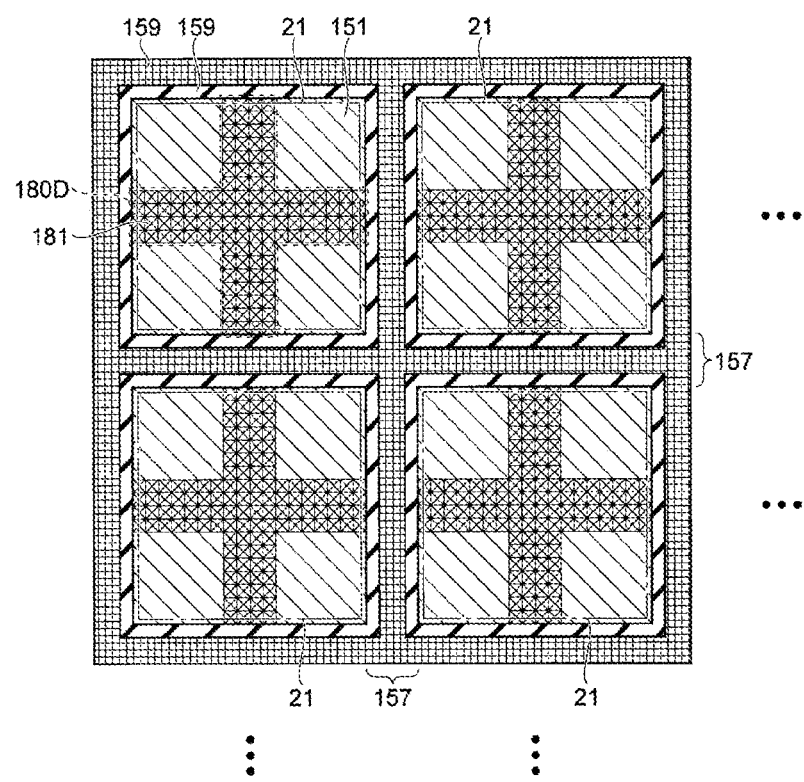
FIG. 16 is a cross-sectional view showing an exemplary cross-sectional structure of a first chip according to a third modification of the first embodiment.

FIG. 16 is a cross-sectional view showing an exemplary cross-sectional structure of a first chip according to a third modification. FIG. 16 shows, for example, an exemplary cross-sectional structure of a plane corresponding to the plane A-A in the exemplary cross-sectional structure of the first chip 51 shown in FIG. 8.

As shown in FIG. 16, a region 180D in which concave-convex portions 181 are formed may be a cross-shaped region that divides the pixel region into a 2×2 matrix. In other words, regions in which no concave-convex portions 181 are formed may be present at the four corners of the pixel region.

1.13.4 Fourth Modification

Figure 17:
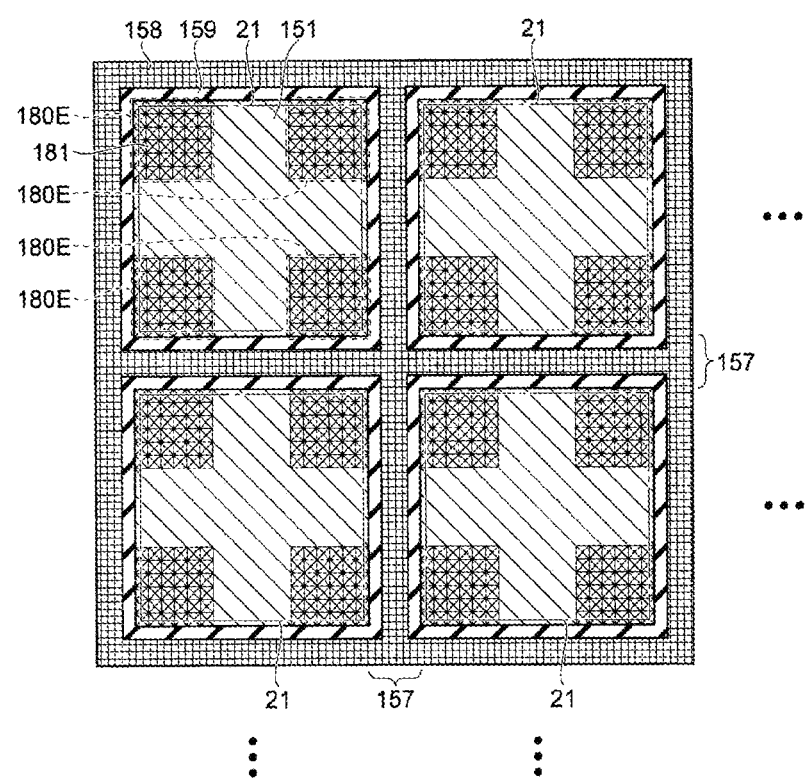
FIG. 17 is a cross-sectional view showing an exemplary cross-sectional structure of a first chip according to a fourth modification of the first embodiment.

FIG. 17 is a cross-sectional view showing an exemplary cross-sectional structure of a first chip according to a fourth modification. Similar to FIG. 16, FIG. 17 shows, for example, an exemplary cross-sectional structure of a plane corresponding to the plane A-A in the exemplary cross-sectional structure of the first chip 51 shown in FIG. 8.

As shown in FIG. 17, regions 180E in which concave-convex portions 181 are formed may be the four corners of the pixel region. In other words, a region in which no concave-convex portions 181 are formed may be present in a cross-shaped region that divides the pixel region into a 2×2 matrix.

1.13.5 Fifth Modification

Figure 18:
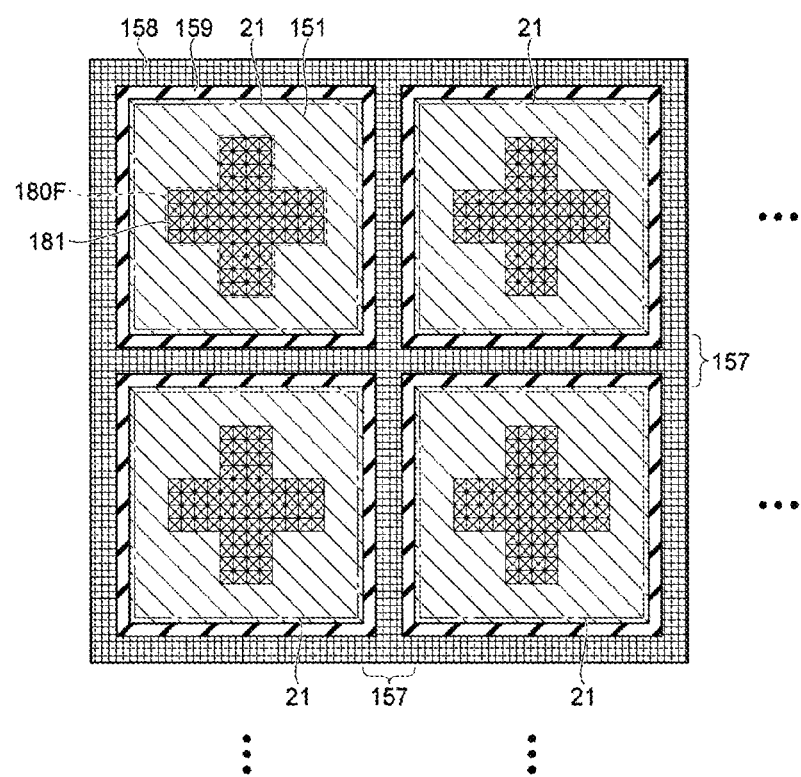
FIG. 18 is a cross-sectional view showing an exemplary cross-sectional structure of a first chip according to a fifth modification of the first embodiment.

FIG. 18 is a cross-sectional view showing an exemplary cross-sectional structure of a first chip according to a fifth modification. Similar to FIG. 16 or 17, FIG. 18 shows, for example, an exemplary cross-sectional structure of a plane corresponding to the plane A-A in the exemplary cross-sectional structure of the first chip 51 shown in FIG. 8.

As shown in FIG. 18, a region 180F in which concave-convex portions 181 are formed may be a cross-shaped region located in the center of the pixel region, for example, above the regions of the N+ type semiconductor region 155 and the P+ type semiconductor region 154.

As in the first to fifth modifications described above, the concave-convex portions 181 according to the first embodiment do not have to be formed in the entire pixel region and may be formed in at least a part of the pixel region. The first embodiment and its modifications described above are merely examples and can be variously modified.

2. Second Embodiment

Next, a second embodiment will be described in detail below with reference to the drawings.

The case where the region for photoelectrical conversion, that is, the N− type semiconductor region 151, is a rectangular parallelepiped is illustrated in the first embodiment and its modifications described above. However, for example, the time taken until an electric charge generated in an area in the vicinity of the inside surface of the semiconductor substrate 150, particularly in the vicinity of the element separation portion 157 in the pixel region, is introduced into the P+ type semiconductor region 154 is long since the distance to the P+ type semiconductor region 154 from that area is long. Therefore, temporal jitter occurs due to the difference in the time taken until an electric charge generated on the outside surface side of the semiconductor substrate 150 or in the vicinity of the P+ type semiconductor region 154 is introduced into the P+ type semiconductor region 154, such that there is a possibility that the distance measuring precision decreases.

Thus, in the present embodiment, a solid-state imaging device and a distance measuring device capable of reducing temporal jitter and limiting a decrease in the distance measuring precision will be described with reference to examples. In the following description, the same components as those of the above embodiment or its modifications will be denoted by the same reference numerals and detailed description thereof will be omitted.

The basic configurations and operations of the solid-state imaging device and the distance measuring device according to the present embodiment may be the same as those of the above embodiment or its modifications. However, in the present embodiment, the cross-sectional structure of the photoelectric conversion portion 21 formed on the first chip 51 is replaced with an exemplary cross-sectional structure that will be described later.

2.1 Exemplary Cross-Sectional Structure

Figure 19:
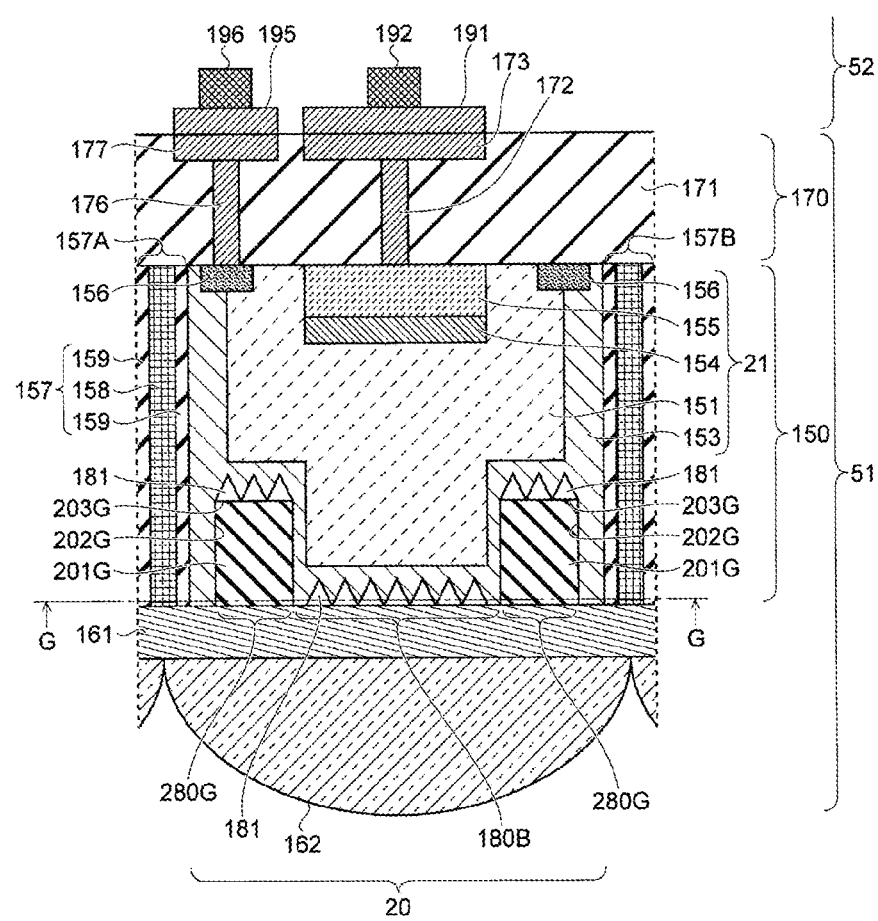
FIG. 19 is a cross-sectional view showing an exemplary cross-sectional structure of a first chip according to a second embodiment.
Figure 20:
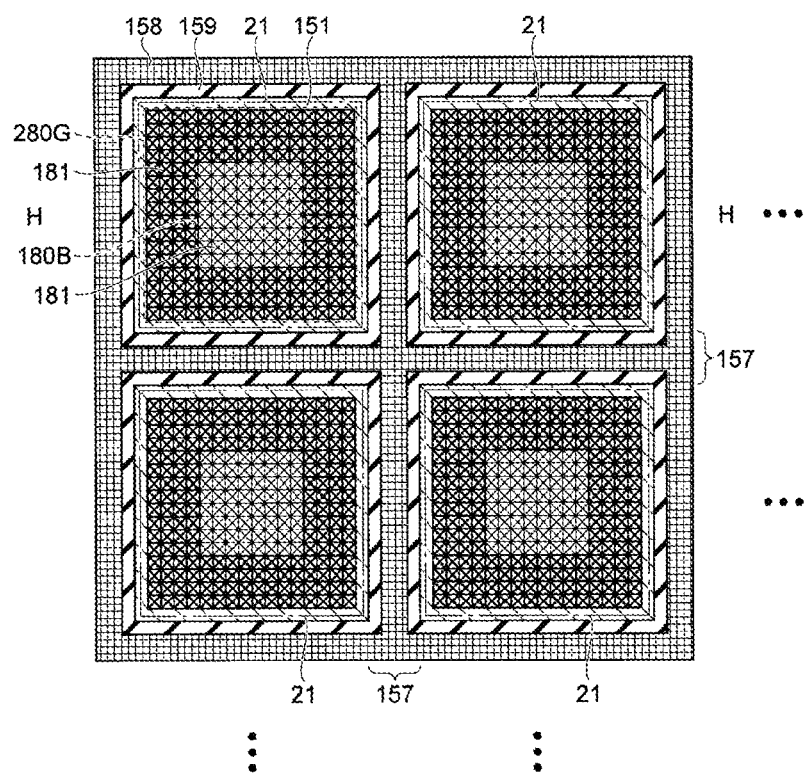
FIG. 20 is a cross-sectional view showing a cross-sectional structure of plane G-G in FIG. 19.

FIG. 19 is a cross-sectional view showing an exemplary cross-sectional structure of a first chip according to the second embodiment. FIG. 20 is a cross-sectional view showing a cross-sectional structure of plane G-G in FIG. 19. FIG. 19 shows an exemplary cross-sectional structure of a photoelectric conversion portion 21 in one SPAD pixel 20. However, in reality, photoelectric conversion portions 21 having the cross-sectional structure illustrated in FIG. 19 are arranged on the first chip 51 in a matrix as shown in FIG. 20. In FIG. 19, a lower surface of the first chip 51 is a light incident surface.

As shown in FIGS. 19 and 20, the first chip 51 according to the present embodiment has a trench 202G in the outer periphery of the pixel region on the inside surface of the semiconductor substrate 150, for example, in a region 280G located above the contact layer 156 in the same cross-sectional structure as that of the first chip 51 described with reference to FIGS. 12 and 13 in the first modification of the first embodiment, such that the light incident surface 203G at that portion (that is, the bottom surface of the trench 202G) is configured to approach the P+ type semiconductor region 154 (hereinafter referred to as "raised").

Steps are provided in portions corresponding to the region 280G in the N− type semiconductor region 151 and the P-type semiconductor region 153 to secure a region in which the trench 202G is arranged.

For example, a light transmitting film 201G for guiding light incident through the flattening film 161 to the photoelectric conversion portion 21 may be provided inside the trench 202G. For example, a material that transmits visible light, infrared light, or the like, such as a silicon oxide film or a silicon nitride film, may be used for the light transmitting film 201G.

A plurality of regularly or randomly arranged concave-convex portions 181 may be provided on the bottom surface (the light incident surface 203G) of the trench 202G, similar to the region 180B located in the center of the pixel region on the inside surface of the semiconductor substrate 150, for example, above the N+ type semiconductor region 155 and the P+ type semiconductor region 154.

2.2 Operation and Advantages

By providing the above configuration according to the present embodiment, it is possible to reduce the difference in the moving distance of an electric charge generated by photoelectric conversion, such that it is possible to reduce temporal jitter due to the difference in the time taken for an electric charge to be introduced into the P+ type semiconductor region 154 and thus to limit a decrease in the distance measuring precision.

Other configurations, operations and advantages may be the same as those of the above embodiment or its modifications and thus detailed description thereof will be omitted here.

2.3 Modifications

The case where the outer peripheral portion of the pixel region on the inside surface of the semiconductor substrate 150, for example, the region above the contact layer 156, is raised and concave-convex portions 181 are provided in each of in the raised region 280G and the center of the pixel region, for example, the region 180B located above the N+ type semiconductor region 155 and the P+ type semiconductor region 154, is illustrated in the second embodiment described above. However, the raised region and the region in which concave-convex portions 181 are formed are not limited to these. Thus, modifications of the region in which the trench is formed and the region in which concave-convex portions are formed will be described below with reference to some examples.

2.3.1 First Modification

Figure 21:
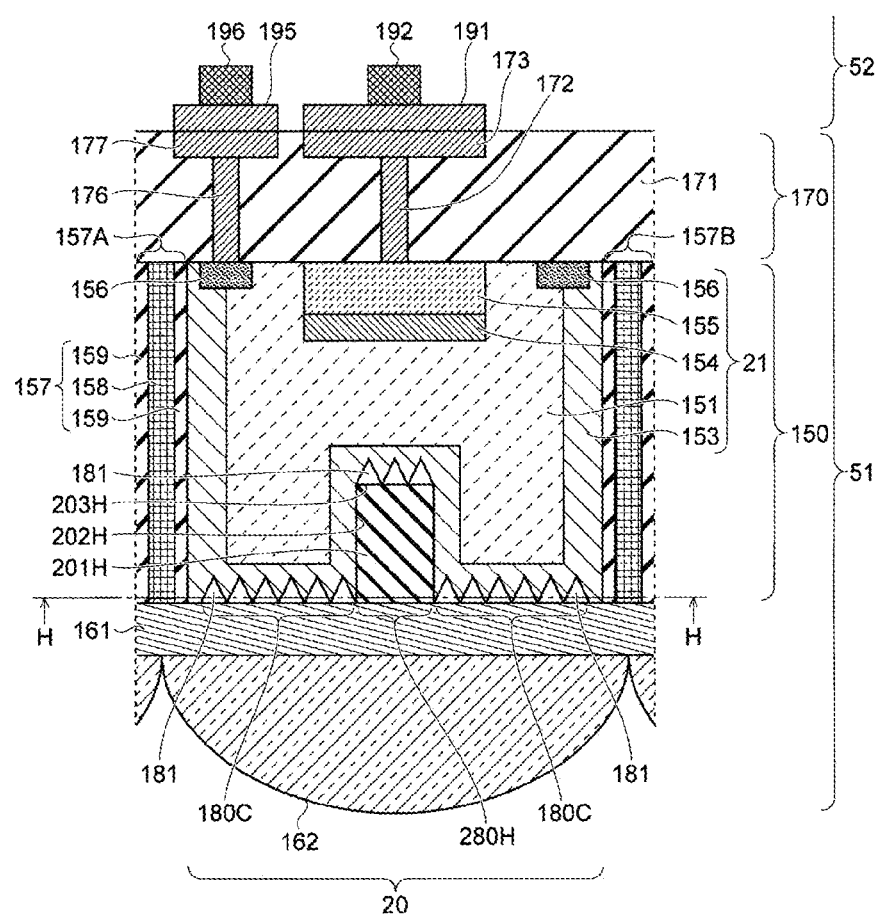
FIG. 21 is a cross-sectional view showing an exemplary cross-sectional structure of a first chip according to a first modification of the second embodiment.
Figure 22:
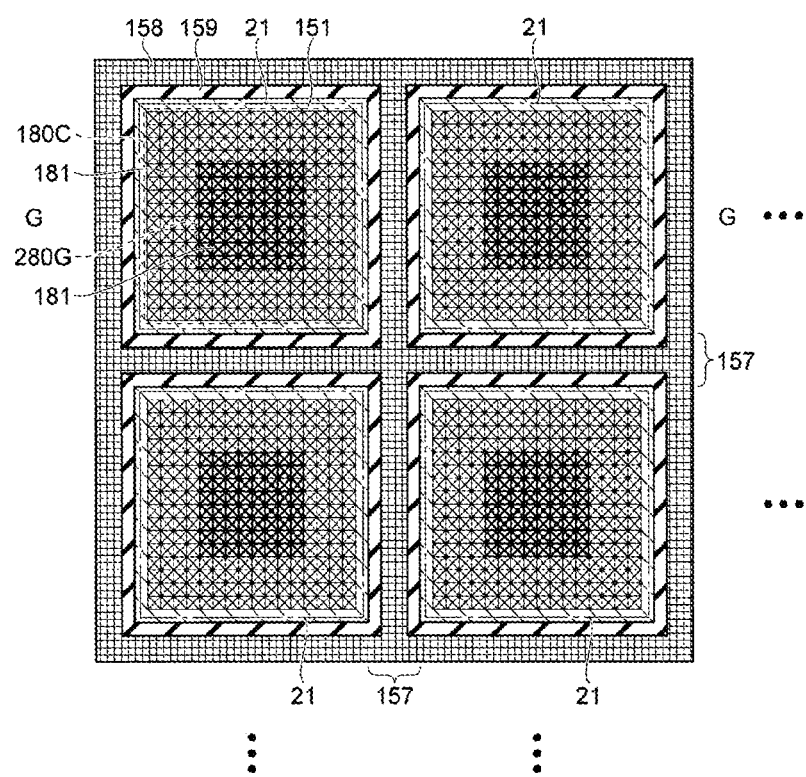
FIG. 22 is a cross-sectional view showing a cross-sectional structure of plane H-H in FIG. 21.

FIG. 21 is a cross-sectional view showing an exemplary cross-sectional structure of a first chip according to a first modification. FIG. 22 is a cross-sectional view showing a cross-sectional structure of plane H-H in FIG. 21. Similar to FIG. 8, FIG. 21 shows an exemplary cross-sectional structure of a photoelectric conversion portion 21 in one SPAD pixel 20. However, in reality, photoelectric conversion portions 21 having the cross-sectional structure illustrated in FIG. 21 are arranged on the first chip 51 in a matrix as shown in FIG. 22. In FIG. 21, a lower surface of the first chip 51 is a light incident surface.

As shown in FIGS. 21 and 22, the first chip 51 according to the present embodiment has a trench 202H in the center of the pixel region on the inside surface of the semiconductor substrate 150, for example, in a region 280H located above the N+ type semiconductor region 155 and the P+ type semiconductor region 154 in the same cross-sectional structure as that of the first chip 51 described with reference to FIGS. 14 and 15 in the second modification of the first embodiment, such that the light incident surface 203H at that portion (that is, the bottom surface of the trench 202H) is configured (raised) to approach the P+ type semiconductor region 154.

A recess is provided in portions corresponding to the region 280H in the N− type semiconductor region 151 and the P− type semiconductor region 153 to secure a region in which the trench 202H is arranged.

For example, a light transmitting film 201H for guiding light incident through the flattening film 161 to the photoelectric conversion portion 21 may be provided inside the trench 202H, similar to the first modification. For example, a material that transmits visible light, infrared light, or the like, such as a silicon oxide film or a silicon nitride film, may be used for the light transmitting film 201H.

A plurality of regularly or randomly arranged concave-convex portions 181 may be provided on the bottom surface (the light incident surface 203H) of the trench 202H, similar to the region 180C located on the outer periphery of the pixel region on the inside surface of the semiconductor substrate 150, for example, above the contact layer 156.

2.3.2 Second Modification

Figure 23:
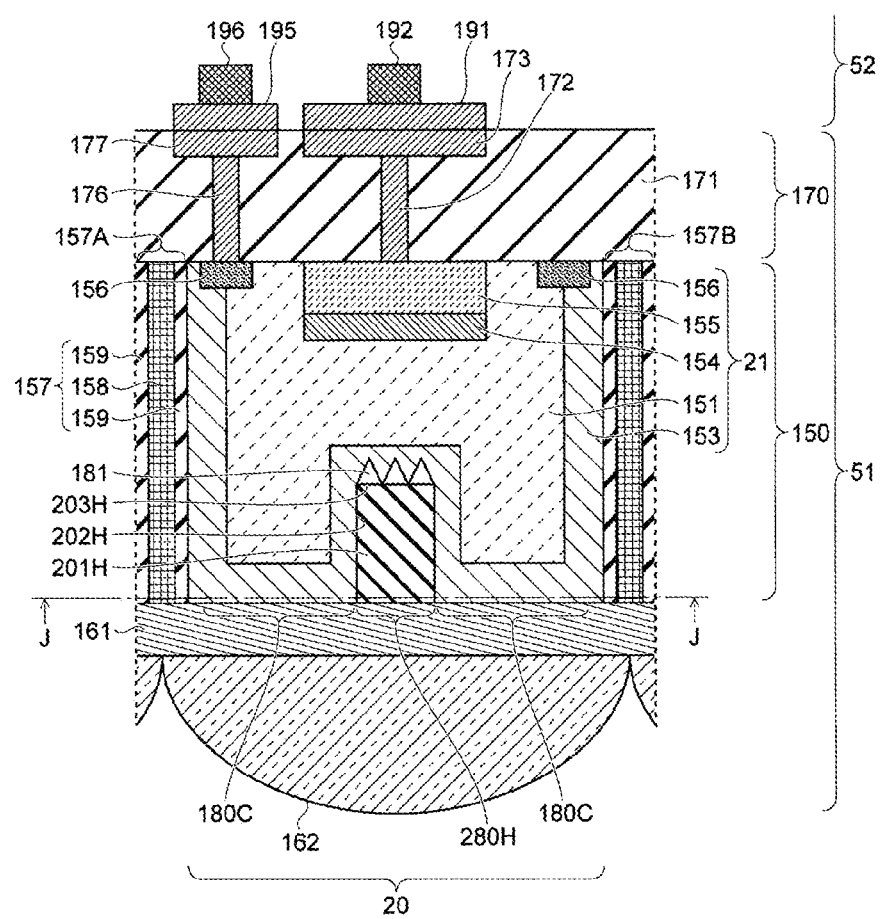
FIG. 23 is a cross-sectional view showing an exemplary cross-sectional structure of a first chip according to a second modification of the second embodiment.
Figure 24:
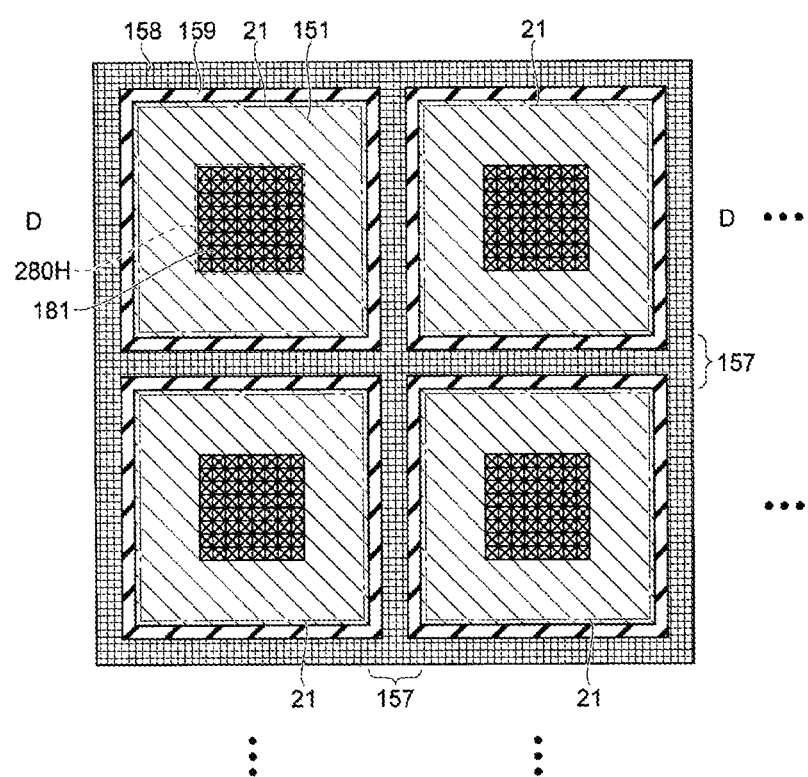
FIG. 24 is a cross-sectional view showing a cross-sectional structure of plane J-J in FIG. 23.

FIG. 23 is a cross-sectional view showing an exemplary cross-sectional structure of a first chip according to a second modification. FIG. 24 is a cross-sectional view showing a cross-sectional structure of plane J-J in FIG. 23. Similar to FIG. 8, FIG. 23 shows an exemplary cross-sectional structure of a photoelectric conversion portion 21 in one SPAD pixel 20. However, in reality, photoelectric conversion portions 21 having the cross-sectional structure illustrated in FIG. 23 are arranged on the first chip 51 in a matrix as shown in FIG. 24. In FIG. 23, a lower surface of the first chip 51 is a light incident surface.

The case where a plurality of regularly or randomly arranged concave-convex portions 181 are provided on both the region 180C located on the outer periphery of the pixel region on the inside surface of the semiconductor substrate 150, for example, above the contact layer 156, and the region 280H located in the center thereof, for example, above the N+ type semiconductor region 155 and the P+ type semiconductor region 154 is illustrated in the second modification described above. However, the present disclosure is not limited to such a configuration and can have a configuration in which no concave-convex portions 181 are formed in one of the region 180C and the region 280H, for example, as shown in FIGS. 23 and 24. The case where the concave-convex portions 181 of the region 180C are omitted is illustrated in FIGS. 23 and 24.

2.3.3 Third Modification

Figure 25:
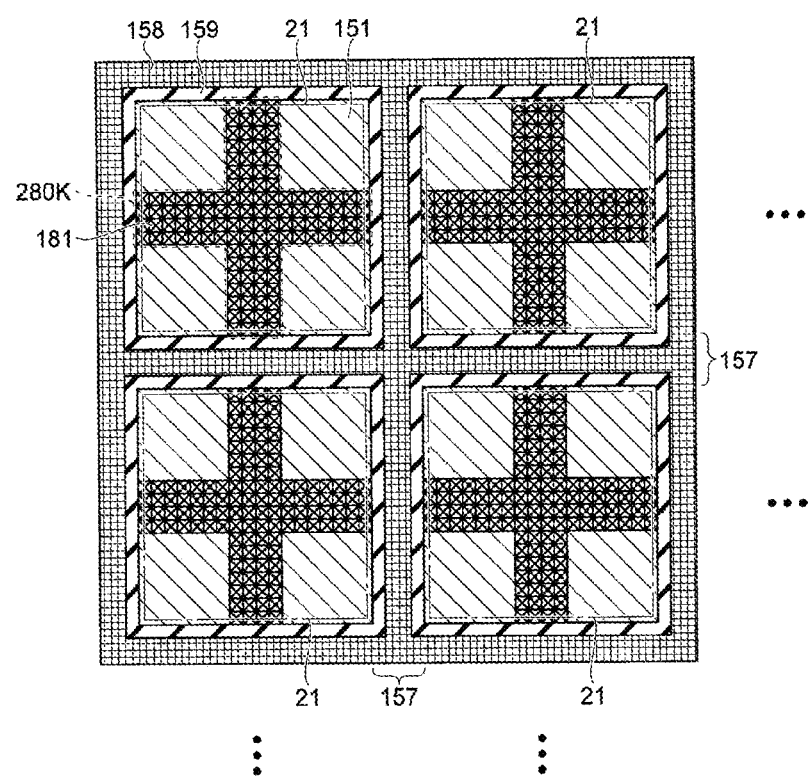
FIG. 25 is a cross-sectional view showing an exemplary cross-sectional structure of a first chip according to a third modification of the second embodiment.

FIG. 25 is a cross-sectional view showing an exemplary cross-sectional structure of a first chip according to a third modification. FIG. 25 shows, for example, an exemplary cross-sectional structure of a plane corresponding to the plane G-G in the exemplary cross-sectional structure of the first chip 51 shown in FIG. 19.

As shown in FIG. 25, a raised region 280K may be a cross-shaped region that divides the pixel region into a 2×2 matrix. The concave-convex portions 181 may be formed in the raised region 280K or may be formed in a non-raised region (a region other than the region 280K in each pixel region) or may be formed in all of these regions.

2.3.4 Fourth Modification

Figure 26:
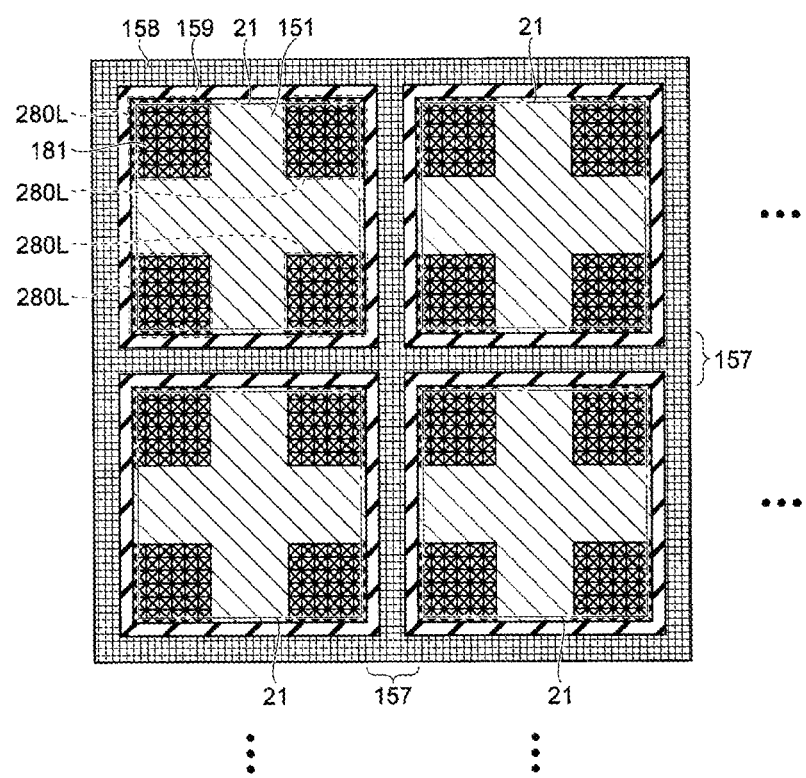
FIG. 26 is a cross-sectional view showing an exemplary cross-sectional structure of a first chip according to a fourth modification of the second embodiment.

FIG. 26 is a cross-sectional view showing an exemplary cross-sectional structure of a first chip according to a fourth modification. Similar to FIG. 25, FIG. 26 shows, for example, an exemplary cross-sectional structure of a plane corresponding to the plane G-G in the exemplary cross-sectional structure of the first chip 51 shown in FIG. 19.

As shown in FIG. 26, raised regions 280L may be the four corners of the pixel region. The concave-convex portions 181 may be formed in each of the four raised regions 280L or may be formed in a non-raised region (a region other than the region 280L in each pixel region) or may be formed in all of these regions.

2.3.5 Fifth Modification

Figure 27:
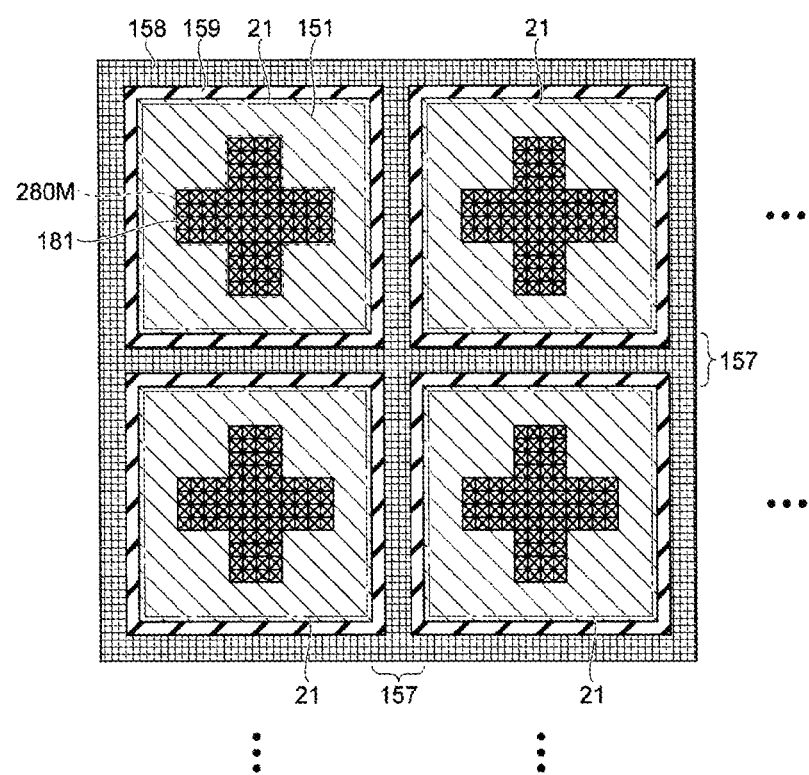
FIG. 27 is a cross-sectional view showing an exemplary cross-sectional structure of a first chip according to a fifth modification of the second embodiment.

FIG. 27 is a cross-sectional view showing an exemplary cross-sectional structure of a first chip according to a fifth modification. Similar to FIG. 25 or 26, FIG. 27 shows, for example, an exemplary cross-sectional structure of a plane corresponding to the plane G-G in the exemplary cross-sectional structure of the first chip 51 shown in FIG. 19.

As shown in FIG. 27, a raised region 280M may be a cross-shaped region located in the center of the pixel region, for example, above the N+ type semiconductor region 155 and the P+ type semiconductor region 154. The concave-convex portions 181 may be formed in the raised region 280M or may be formed in a non-raised region (a region other than the region 280M in each pixel region) or may be formed in all of these regions.

As in the first to fifth modifications described above, the raised region is not limited to the outer periphery of the pixel region, for example, the vicinity of the region above the contact layer 156, and can be variously modified. The second embodiment and its modifications described above are merely examples and can be variously modified.

3. Application Examples

The technology according to the present disclosure can be applied to various products. For example, the technology according to the present disclosure may be realized as a device mounted on a moving body of any type such as an automobile, an electric vehicle, a hybrid electric vehicle, a motorcycle, a bicycle, a personal mobility, an airplane, a drone, a ship, a robot, a construction machine, or an agricultural machine (tractor).

Figure 28:
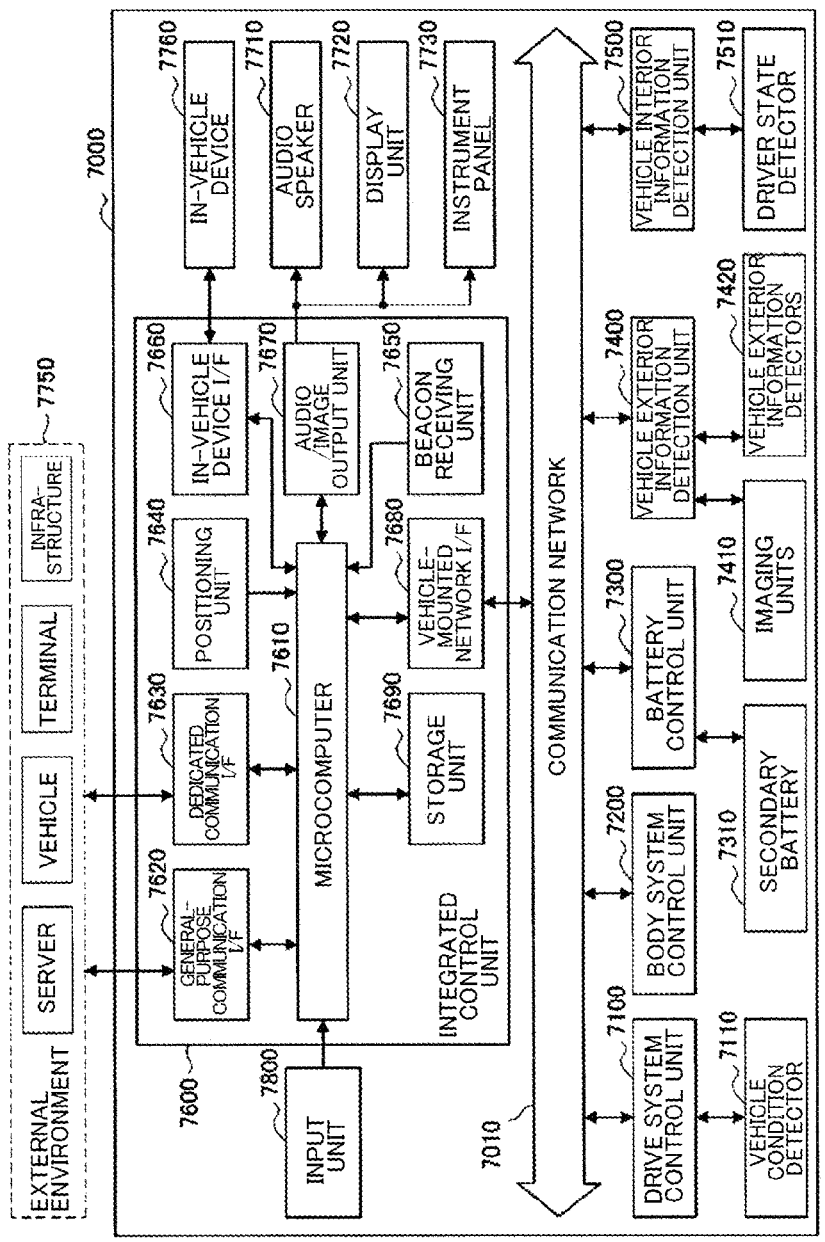
FIG. 28 is a block diagram showing an exemplary schematic configuration of a vehicle control system.

FIG. 28 is a block diagram showing an exemplary schematic configuration of a vehicle control system 7000 which is an example of a mobile body control system to which the technology according to the present disclosure can be applied. The vehicle control system 7000 includes a plurality of electronic control units connected via a communication network 7010. In the example shown in FIG. 28, the vehicle control system 7000 includes a drive system control unit 7100, a body system control unit 7200, a battery control unit 7300, a vehicle exterior information detection unit 7400, a vehicle interior information detection unit 7500, and an integrated control unit 7600. A communication network 7010 connecting these control units may be a vehicle-mounted communication network compliant with any standard such as a controller area network (CAN), a local interconnect network (LIN), a local area network (LAN), or FlexRay (registered trademark).

Each control unit includes a microcomputer that performs arithmetic processing according to various programs, a storage unit that stores programs executed by the microcomputer or parameters used for various calculations, and a drive circuit that drives various devices to be controlled. Each control unit also includes a network I/F for communicating with other control units via the communication network 7010 and a communication I/F for communicating with devices, sensors, or the like inside or outside the vehicle through wired communication or wireless communication. In FIG. 28, a microcomputer 7610, a general-purpose communication I/F 7620, a dedicated communication I/F 7630, a positioning unit 7640, a beacon receiving unit 7650, an in-vehicle device I/F 7660, an audio/image output unit 7670, a vehicle-mounted network I/F 7680, and a storage unit 7690 are shown as functional components of the integrated control unit 7600. Other control units also include a microcomputer, a communication I/F, a storage unit, and the like.

The drive system control unit 7100 controls the operation of devices relating to the drive system of the vehicle according to various programs. For example, the drive system control unit 7100 functions as a control device for a driving force generation device for generating the driving force of the vehicle such as an internal combustion engine or a drive motor, a driving force transmission mechanism for transmitting the driving force to the wheels, a steering mechanism for adjusting the steering angle of the vehicle, a braking device for generating the braking force of the vehicle, or the like. The drive system control unit 7100 may function as a control device for an antilock brake system (ABS), an electronic stability control (ESC), or the like.

A vehicle condition detector 7110 is connected to the drive system control unit 7100. The vehicle condition detector 7110 may include, for example, at least one of a gyro sensor that detects the angular velocity of an axial rotational movement of the vehicle body, an acceleration sensor that detects the acceleration of the vehicle, and sensors for detecting the amount of operation of an accelerator pedal, the amount of operation of a brake pedal, the steering angle of a steering wheel, the engine speed, and the rotational speed of the wheels. The drive system control unit 7100 performs arithmetic processing using signals input from the vehicle condition detector 7110 to control the internal combustion engine, the drive motor, an electric power steering device, a brake device, or the like.

The body system control unit 7200 controls the operation of various devices mounted in the vehicle body according to various programs. For example, the body system control unit 7200 functions as a control device for a keyless entry system, a smart key system, a power window device, or various lamps such as headlamps, back lamps, brake lamps, blinkers, or fog lamps. In this case, radio waves transmitted from a portable device that substitutes for the key or signals of various switches may be input to the body system control unit 7200. The body system control unit 7200 receives inputs of these radio waves or signals and controls a door lock device, the power window device, the lamps, and the like of the vehicle.

The battery control unit 7300 controls a secondary battery 7310, which is a power supply source of the drive motor, according to various programs. For example, information such as the battery temperature, the battery output voltage, or the remaining capacity of the battery is input to the battery control unit 7300 from a battery device including the secondary battery 7310. The battery control unit 7300 performs arithmetic processing using these signals and performs temperature adjustment control of the secondary battery 7310 or control of a cooling device or the like provided in the battery device.

The vehicle exterior information detection unit 7400 detects information outside the vehicle in which the vehicle control system 7000 is mounted. For example, at least one of imaging units 7410 and vehicle exterior information detectors 7420 is connected to the vehicle exterior information detection unit 7400. The imaging units 7410 include at least one of a time of flight (ToF) camera, a stereo camera, a monocular camera, an infrared camera, and other cameras. The vehicle exterior information detectors 7420 include, for example, at least one of an environmental sensor for detecting the current weather or weather conditions or an ambient information detection sensor for detecting other vehicles, obstacles, pedestrians, or the like around the vehicle in which the vehicle control system 7000 is mounted.

The environmental sensor may be, for example, at least one of a raindrop sensor that detects rainy weather, a fog sensor that detects fog, a sunshine sensor that detects the degree of sunshine, and a snow sensor that detects snowfall. The ambient information detection sensor may be at least one of an ultrasonic sensor, a radar device, and a 'light detection and ranging, laser imaging detection and ranging (LIDAR) device. The imaging units 7410 and the vehicle exterior information detectors 7420 may be provided as independent sensors or devices or may be provided as a device into which a plurality of sensors or devices are integrated.

Figure 29:
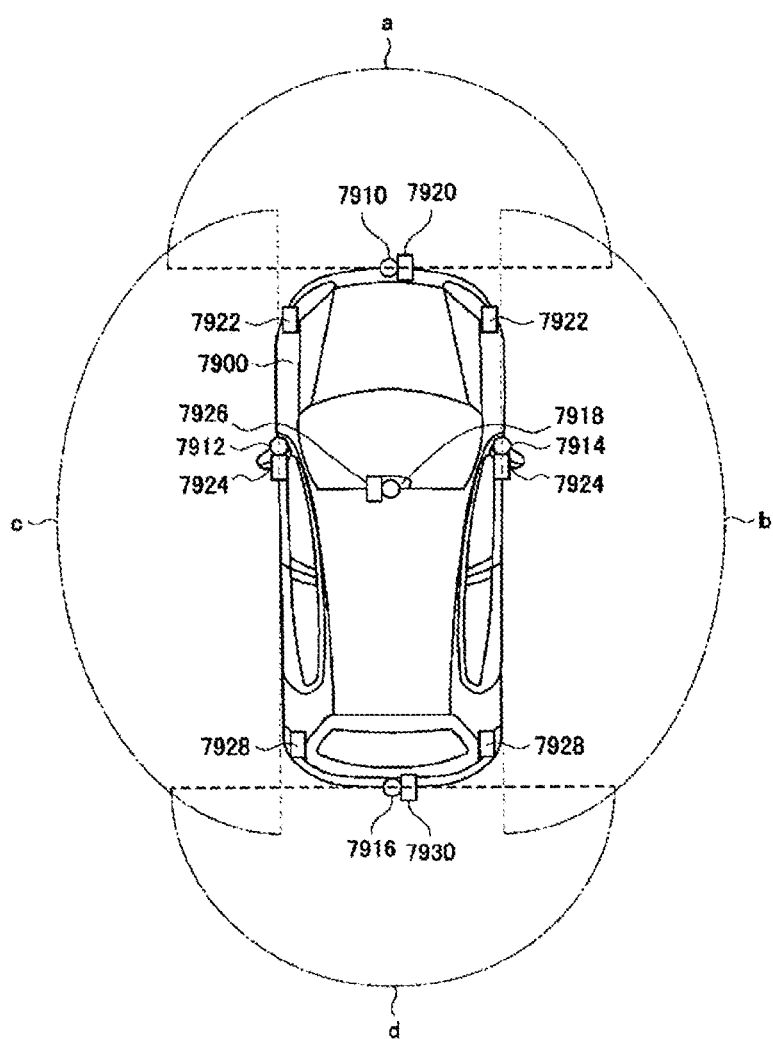
FIG. 29 is an explanatory diagram showing an example of the installation positions of vehicle exterior information detection units and imaging units.

Here, FIG. 29 shows an example of the installation positions of the imaging units 7410 and the vehicle exterior information detectors 7420. Imaging units 7910, 7912, 7914, 7916, and 7918 are provided, for example, at the positions of at least one of a front nose, side mirrors, a rear bumper, a back door, and an upper part of a windshield in the occupant compartment of the vehicle 7900. The imaging unit 7910 provided on the front nose and the imaging unit 7918 provided on the upper part of the windshield in the occupant compartment mainly acquire images in front of the vehicle 7900. The imaging units 7912 and 7914 provided on the side mirrors mainly acquire images on the sides of the vehicle 7900. The imaging unit 7916 provided on the rear bumper or the back door mainly acquires images behind the vehicle 7900. The imaging unit 7918 provided on the upper part of the windshield in the occupant compartment is mainly used to detect a preceding vehicle, a pedestrian, an obstacle, a traffic light, a traffic sign, a lane, or the like.

FIG. 29 also shows an example of the imaging ranges of the imaging units 7910, 7912, 7914, and 7916. The imaging range a indicates the imaging range of the imaging unit 7910 provided on the front nose, the imaging ranges b and c indicate the imaging ranges of the imaging units 7912 and 7914 provided on the side mirrors, respectively, and the imaging range d indicates the imaging range of the imaging unit 7916 provided on the rear bumper or the back door. For example, an overhead view image of the vehicle 7900 as viewed from above can be obtained by superimposing image data captured by the imaging units 7910, 7912, 7914, and 7916.

The vehicle exterior information detectors 7920, 7922, 7924, 7926, 7928, and 7930 provided on the front, the rear, the sides, the corners, and the upper part of the windshield in the occupant compartment of the vehicle 7900 may each be, for example, an ultrasonic sensor or a radar device. The vehicle exterior information detectors 7920, 7926, and 7930 provided on the front nose, the rear bumper, the back door, and the upper part of the windshield in the occupant compartment of the vehicle 7900 may each be, for example, a LIDAR device. These vehicle exterior information detectors 7920 to 7930 are mainly used to detect a preceding vehicle, a pedestrian, an obstacle, or the like.

The description will continue returning to FIG. 28. The vehicle exterior information detection unit 7400 causes the imaging units 7410 to capture images outside the vehicle and receives the captured image data. The vehicle exterior information detection unit 7400 also receives detection information from the connected vehicle exterior information detectors 7420. When the vehicle exterior information detectors 7420 are each an ultrasonic sensor, a radar device, or a LIDAR device, the vehicle exterior information detection unit 7400 transmits ultrasonic waves, electromagnetic waves, or the like and receives information of received reflected waves. The vehicle exterior information detection unit 7400 may perform object detection processing or distance detection processing on a person, a vehicle, an obstacle, a sign, a character on a road surface, or the like based on the received information. The vehicle exterior information detection unit 7400 may perform environmental recognition processing for recognizing rainfall, fog, road surface conditions, or the like based on the received information. The vehicle exterior information detection unit 7400 may calculate the distance to an object outside the vehicle based on the received information.

Further, the vehicle exterior information detection unit 7400 may perform image recognition processing or distance detection processing for recognizing a person, a vehicle, an obstacle, a sign, a character on a road surface, or the like based on the received image data. The vehicle exterior information detection unit 7400 may perform processing such as distortion correction or alignment on the received image data and synthesize image data captured by different imaging units 7410 to generate an overhead view image or a panoramic image. The vehicle exterior information detection unit 7400 may perform viewpoint conversion processing using image data captured by different imaging units 7410.

The vehicle interior information detection unit 7500 detects vehicle interior information. For example, a driver state detector 7510 that detects the driver's state is connected to the vehicle interior information detection unit 7500. The driver state detector 7510 may include a camera that captures the driver, a biosensor that detects the driver's biological information, a microphone that collects sound in the occupant compartment, or the like. The biosensor is provided, for example, on a seat surface or the steering wheel and detects biometric information of a passenger sitting in a seat or the driver holding the steering wheel. The vehicle interior information detection unit 7500 may calculate the degree of fatigue or concentration of the driver based on detection information input from the driver state detector 7510 and may determine whether the driver is dozing or not. The vehicle interior information detection unit 7500 may perform processing such as noise canceling processing on the collected audio signal.

The integrated control unit 7600 controls the overall operation of the vehicle control system 7000 according to various programs. An input unit 7800 is connected to the integrated control unit 7600. The input unit 7800 is realized, for example, by a device on which an input operation can be performed by a passenger such as a touch panel, a button, a microphone, a switch, a lever, or the like. Data obtained by performing voice recognition on audio input through the microphone may be input to the integrated control unit 7600. The input unit 7800 may be, for example, a remote control device using infrared rays or other radio waves or an externally connected device such as a mobile phone or a personal digital assistant (PDA) that supports an operation on the vehicle control system 7000. The input unit 7800 may be, for example, a camera, in which case the passenger can input information by gesture. Alternatively, data obtained by detecting the movement of a wearable device worn by the passenger may be input. Further, the input unit 7800 may include, for example, an input control circuit that generates an input signal based on information input by the passenger or the like using the input unit 7800 and outputs the input signal to the integrated control unit 7600. By operating the input unit 7800, the passenger or the like inputs various data to the vehicle control system 7000 and instructs the vehicle control system 7000 to perform a processing operation.

The storage unit 7690 may include a read only memory (ROM) for storing various programs executed by the microcomputer and a random access memory (RAM) for storing various parameters, calculation results, sensor values, and the like. The storage unit 7690 may be realized by a magnetic storage device such as a hard disk drive (HDD), a semiconductor storage device, an optical storage device, a magneto-optical storage device, or the like.

The general-purpose communication I/F 7620 is a general-purpose communication I/F that mediates communication with various devices present in the external environment 7750. The general-purpose communication I/F 7620 may implement a cellular communication protocol such as global system of mobile communications (GSM) (registered trademark), WiMAX (registered trademark), long term evolution (LTE) (registered trademark), or LTE-advanced (LTE-A), or other wireless communication protocols such as wireless LAN (also called Wi-Fi (registered trademark)) or Bluetooth (registered trademark). The general-purpose communication I/F 7620 may be connected with a device (for example, an application server or a control server) present on an external network (for example, the Internet, a cloud network, or a business-specific network), for example, via a base station or an access point. The general-purpose communication I/F 7620 may also be connected with a terminal present in the vicinity of the vehicle (for example, a terminal of a driver, a pedestrian, or a store or a machine type communication (MTC) terminal), for example, using a peer to peer (P2P) technology.

The dedicated communication I/F 7630 is a communication I/F that supports a communication protocol designed for use in a vehicle. The dedicated communication I/F 7630 may implement, for example, a standard protocol such as wireless access in vehicle environment (WAVE) which is a combination of the lower layer IEEE802.11p and the upper layer IEEE1609, dedicated short range communications (DSRC), or a cellular communication protocol. The dedicated communication I/F 7630 typically performs V2X communication, which is a concept including one or more of vehicle to vehicle communication, vehicle to infrastructure communication, vehicle to home communication, and vehicle to pedestrian communication.

The positioning unit 7640 receives, for example, global navigation satellite system (GNSS) signals from GNSS satellites (for example, global positioning system (GPS) signals from GPS satellites) and executes positioning to generate position information including the latitude, longitude, and altitude of the vehicle. The positioning unit 7640 may identify the current position by exchanging a signal with a wireless access point or may acquire position information from a terminal such as a mobile phone, a PHS, or a smartphone having a positioning function.

For example, the beacon receiving unit 7650 receives radio waves or electromagnetic waves transmitted from a radio station or the like installed on a road and acquires information such as the current position, traffic jam, road closure, or required time. The function of the beacon receiving unit 7650 may be included in the dedicated communication I/F 7630 described above.

The in-vehicle device I/F 7660 is a communication interface that mediates the connection between the microcomputer 7610 and various in-vehicle devices 7760 present in the vehicle. The in-vehicle device I/F 7660 may establish a wireless connection using a wireless communication protocol such as wireless LAN, Bluetooth (registered trademark), near field communication (NFC), or wireless USB (WUSB). The in-vehicle device I/F 7660 may also establish a wired connection such as universal serial bus (USB), high-definition multimedia interface (HDMI) (registered trademark), or mobile high-definition link (MHL) via a connection terminal (and a cable if necessary) (not shown). The in-vehicle devices 7760 may include, for example, at least one of a mobile device or a wearable device owned by a passenger or an information device carried in or attached to a vehicle. The in-vehicle devices 7760 may also include a navigation device that searches for a route to an arbitrary destination. The in-vehicle device I/F 7660 exchanges control signals or data signals with these in-vehicle devices 7760.

The vehicle-mounted network I/F 7680 is an interface that mediates communication between the microcomputer 7610 and the communication network 7010. The vehicle-mounted network I/F 7680 transmits and receives signals or the like according to a predetermined protocol supported by the communication network 7010.

The microcomputer 7610 of the integrated control unit 7600 controls the vehicle control system 7000 according to various programs based on information acquired via at least one of the general-purpose communication I/F 7620, the dedicated communication I/F 7630, the positioning unit 7640, the beacon receiving unit 7650, the in-vehicle device I/F 7660, and the vehicle-mounted network I/F 7680. For example, the microcomputer 7610 may calculate a control target value for the driving force generation device, the steering mechanism, or the braking device based on the acquired information inside and outside the vehicle and output a control command to the drive system control unit 7100. For example, the microcomputer 7610 may perform cooperative control for the purpose of realizing the functions of an advanced driver assistance system (ADAS) including vehicle collision avoidance or impact mitigation, following travel based on an inter-vehicle distance, vehicle speed maintenance travel, vehicle collision warning, or vehicle lane deviation warning. The microcomputer 7610 may also perform cooperative control for the purpose of automated driving for the vehicle to travel autonomously without relying on the driver's operation or the like by controlling the driving force generation device, the steering mechanism, the braking device, or the like based on the acquired information around the vehicle.

The microcomputer 7610 may generate three-dimensional distance information between the vehicle and objects such as structures, people, or the like around the vehicle based on information acquired via at least one of the general-purpose communication I/F 7620, the dedicated communication I/F 7630, the positioning unit 7640, the beacon receiving unit 7650, the in-vehicle device I/F 7660, and the vehicle-mounted network I/F 7680 and create local map information including information around the current position of the vehicle. The microcomputer 7610 may also predict a danger such as a vehicle collision, a pedestrian or the like approaching the vehicle, or entering a closed road based on the acquired information and generate a warning signal. The warning signal may be, for example, a signal for generating a warning sound or turning on a warning lamp.

The audio/image output unit 7670 transmits an output signal which is at least one of audio and an image to an output device capable of visually or audibly providing notification information to the passenger of the vehicle or the outside of the vehicle. In the example of FIG. 28, an audio speaker 7710, a display unit 7720, and an instrument panel 7730 are illustrated as output devices. The display unit 7720 may include, for example, at least one of an onboard display and a heads-up display. The display unit 7720 may have an augmented reality (AR) display function. The output device may be devices other than these devices such as headphones, a wearable device such as an eyeglass-type display worn by the passenger, or a projector or lamp. When the output device is a display device, the display device visually displays results obtained by the microcomputer 7610 performing various processing or information received from other control units in various formats such as text, an image, a table, or a graph. When the output device is an audio output device, the audio output device converts an audio signal composed of reproduced audio data, acoustic data, or the like into an analog signal and audibly outputs the analog signal.

In the example shown in FIG. 28, at least two control units connected via the communication network 7010 may be integrated into one control unit. Alternatively, each control unit may be made of a plurality of control units. Further, the vehicle control system 7000 may include a different control unit (not shown). In the above description, some or all of the functions carried out by any of the control units may be included in another control unit. That is, predetermined arithmetic processing may be performed by any control unit as long as information is transmitted and received via the communication network 7010. Similarly, a plurality of control units may transmit and receive detection information to and from each other via the communication network 7010, while a sensor or a device connected to one of the control units is connected to another control unit.

A computer program for realizing each function of the ToF sensor 1 according to the present embodiment described with reference to FIG. 1 can be implemented in any control unit or the like. A computer-readable recording medium in which such a computer program is stored can be provided. The recording medium is, for example, a magnetic disk, an optical disc, a magneto-optical disc, or a flash memory. The computer program may be distributed, for example, via a network without using a recording medium.

In the vehicle control system 7000 described above, the ToF sensor 1 according to the present embodiment described with reference to FIG. 1 can be applied to the integrated control unit 7600 in the exemplary application shown in FIG. 28. For example, the controller 11, the calculation unit 15, and the external I/F 19 of the ToF sensor 1 correspond to the microcomputer 7610, the storage unit 7690, and the vehicle-mounted network I/F 7680 of the integrated control unit 7600. However, the present disclosure is not limited to this and the vehicle control system 7000 may correspond to the host 80 in FIG. 1.

Further, at least one of the components of the ToF sensor 1 according to the present embodiment described with reference to FIG. 1 may be realized in a module for the integrated control unit 7600 shown in FIG. 28 (for example, an integrated circuit module made of one die). Alternatively, the ToF sensor 1 according to the present embodiment described with reference to FIG. 1 may be realized by a plurality of control units in the vehicle control system 7000 shown in FIG. 28.

Although embodiments of the present disclosure have been described above, the technical scope of the present disclosure is not limited to the above embodiments as they are and various changes can be made without departing from the gist of the present disclosure. Components in different embodiments and modifications may also be combined as appropriate.

Further, the advantages in each embodiment described in the present specification are merely examples and are not limited and other advantages can also be achieved.

The present technology can also take on the following configurations.

(1)

An avalanche photodiode sensor including:
a first semiconductor substrate; and
a second semiconductor substrate bonded to a first surface of the first semiconductor substrate,
wherein
the first semiconductor substrate includes:
a plurality of photoelectric conversion portions arranged in a matrix; and
an element separation portion for element-separating the plurality of photoelectric conversion portions from each other,
the plurality of photoelectric conversion portions include a first photoelectric conversion portion,
the element separation portion has a first element separation region and a second element separation region,
the first photoelectric conversion portion is arranged between the first element separation region and the second element separation region,
the first semiconductor substrate further includes a plurality of concave-convex portions arranged on a second surface opposite to the first surface and arranged between the first element separation region and the second element separation region, and
the second semiconductor substrate includes a reading circuit connected to each of the photoelectric conversion portions.

(2)

The avalanche photodiode sensor according to (1) above, wherein the first photoelectric conversion portion includes a cathode region of a first conductive type provided on the first surface of the first semiconductor substrate and an anode region of a second conductive type opposite to the first conductive type, the anode region being provided on the first surface.

(3)

The avalanche photodiode sensor according to (2) above, wherein the plurality of concave-convex portions are arranged in a region corresponding to at least the cathode region or the anode region in a substrate thickness direction of the first semiconductor substrate.

(4)

The avalanche photodiode sensor according to any one of (1) to (3) above, wherein the first photoelectric conversion portion is an avalanche photodiode.

(5)

The avalanche photodiode sensor according to any one of (1) to (4) above, wherein each of the first and second element separation regions includes a reflective film or a high refractive index film.

(6)

The avalanche photodiode sensor according to any one of (1) to (5) above, wherein each of the first and second element separation regions penetrates the first semiconductor substrate from the first surface to the second surface.

(7)

The avalanche photodiode sensor according to any one of (1) to (6) above, wherein the plurality of concave-convex portions are arranged on the second surface in an entire region defined by the first and second element separation regions.

(8)

The avalanche photodiode sensor according to (2) above, wherein the plurality of concave-convex portions are arranged on the second surface in a region corresponding to the cathode region in a substrate thickness direction of the first semiconductor substrate.

(9)

The avalanche photodiode sensor according to (2) above, wherein the plurality of concave-convex portions are arranged on the second surface in a region corresponding to the anode region in a substrate thickness direction of the first semiconductor substrate.

(10)

The avalanche photodiode sensor according to (2) above, wherein the element separation portion further includes third and fourth element separation regions that define the first photoelectric conversion portion in a different direction from the first and second element separation regions, and
the plurality of concave-convex portions are arranged on the second surface in a cross-shaped region that divides a rectangular region defined by the first to fourth element separation regions into four.

(11)

The avalanche photodiode sensor according to (2) above, wherein the element separation portion further includes third and fourth element separation regions that define the first photoelectric conversion portion in a different direction from the first and second element separation regions, and
the plurality of concave-convex portions are arranged on the second surface at each of four corners of a rectangular region defined by the first to fourth element separation regions.

(12)

The avalanche photodiode sensor according to (2) above, wherein the plurality of concave-convex portions are arranged on the second surface in a cross-shaped region corresponding to the cathode region in a substrate thickness direction of the first semiconductor substrate.

(13)

The avalanche photodiode sensor according to any one of (1) to (12) above, wherein a trench is provided on the second surface of the first semiconductor substrate in at least a part of a region defined by the first and second element separation regions.

(14)

The avalanche photodiode sensor according to (13) above, wherein the plurality of concave-convex portions are provided on a bottom surface of the trench.

(15)

The avalanche photodiode sensor according to (13) above, wherein the first semiconductor substrate further includes a plurality of concave-convex portions provided on a bottom surface of the trench.

(16)

The avalanche photodiode sensor according to any one of (13) to (15) above, wherein the first semiconductor substrate further includes a light transmitting film provided inside the trench.

(17)

A distance measuring device including:
a light emitting portion configured to emit light of a predetermined wavelength;
an avalanche photodiode sensor configured to generate a pixel signal from received light; and
a calculation unit configured to calculate a distance to an object based on the pixel signal generated by the avalanche photodiode sensor,
wherein
the avalanche photodiode sensor includes:
a first semiconductor substrate; and
a second semiconductor substrate bonded to a first surface of the first semiconductor substrate,
the first semiconductor substrate includes:
a plurality of photoelectric conversion portions arranged in a matrix; and
an element separation portion for element-separating the plurality of photoelectric conversion portions from each other,
the plurality of photoelectric conversion portions include a first photoelectric conversion portion,
the element separation portion has a first element separation region and a second element separation region,
the first photoelectric conversion portion is arranged between the first element separation region and the second element separation region,
the first semiconductor substrate further includes a plurality of concave-convex portions arranged on a second surface opposite to the first surface and arranged between the first element separation region and the second element separation region, and
the second semiconductor substrate includes a reading circuit connected to each of the photoelectric conversion portions.

REFERENCE SIGNS LIST

1 ToF sensor
11 Controller
13 Light emitting portion
14 Light receiving portion
15 Calculation unit
19 External I/F
20 SPAR pixel
21 Photoelectric conversion portion
22 Reading circuit
23 Quench resistor
24 Selection transistor
25 Digital converter
251 Resistor
252 NMOS transistor
26 Inverter
261 PMOS transistor
262 NMOS transistor
27 Buffer
30 Macro pixel
40 SPAD addition unit
41 Pulse shaping unit
42 Received photon counting unit
50 Bonded chip
51 First chip
52 Second chip
80 Host
90 Object
131 Light source
132 Collimator lens
133 Half mirror
134 Drive unit
135 Galvanometer mirror
141 SPAD array
142 Effective region
142-1 to 142-4 SPAD region
143 Timing control circuit
144 Drive circuit
145 Output circuit
146 Light receiving lens
150 Semiconductor substrate
151 N− type semiconductor region
153 P− type semiconductor region
154 P+ type semiconductor region
155 N+ type semiconductor region
156 Contact layer
157 Element separation portion
157A, 157B Element separation region
158 Reflective film
159 Insulating film
161 Flattening film
162 On-chip lens
163 Pinning layer
164 Transparent insulating film
170 Wiring layer
171 Insulating film
172, 176 Via wiring
173, 177, 191 and 195 Electrode pad
180, 180B, 180C, 180D, 180E, 180F, 280G, 280H, 280K, 280L, 280M Region
181 Concave-convex portion
192, 196 Terminal
201G, 201H Light transmitting film
202G, 202H Trench
203G, 203H Incident surface
AR Distance measuring range
L1 Laser light
L2 Reflected light
LD Pixel drive line
LS Output signal line
SR Angle of view

What is claimed is:

1. An avalanche photodiode sensor, comprising:
a first semiconductor substrate; and
a second semiconductor substrate bonded to a first surface of the first semiconductor substrate,
wherein the first semiconductor substrate includes:
   a plurality of photoelectric conversion portions arranged in a matrix;
   an element separation portion for element-separating the plurality of photoelectric conversion portions from each other,
   wherein the plurality of photoelectric conversion portions include a first photoelectric conversion portion,
   wherein the element separation portion has a first element separation region and a second element separation region,
   wherein the first photoelectric conversion portion is arranged between the first element separation region and the second element separation region,
   wherein the first semiconductor substrate further includes a first plurality of concave-convex portions arranged on a second surface of the first semiconductor substrate opposite to the first surface of the first semiconductor substrate and arranged between the first element separation region and the second element separation region, and
   wherein the second semiconductor substrate includes a reading circuit connected to each of the photoelectric conversion portions; and
a flattening film extending above and across the first plurality of concave-convex portions and the element separation portion,
wherein a trench is provided on the second surface of the first semiconductor substrate in at least a part of a region defined by the first and second element separation regions, and
wherein a second plurality of concave-convex portions are provided on a bottom surface of the trench.

2. The avalanche photodiode sensor according to claim 1, wherein the first photoelectric conversion portion includes a cathode region of a first conductive type provided on the first surface of the first semiconductor substrate and an anode region of a second conductive type opposite to the first conductive type, the anode region being provided on the first surface.

3. The avalanche photodiode sensor according to claim 2, wherein the first plurality of concave-convex portions are arranged in a region corresponding to at least the cathode region or the anode region in a substrate thickness direction of the first semiconductor substrate.

4. The avalanche photodiode sensor according to claim 2, wherein the first plurality of concave-convex portions are arranged on the second surface of the first semiconductor substrate in a region corresponding to the cathode region in a substrate thickness direction of the first semiconductor substrate.

5. The avalanche photodiode sensor according to claim 2, wherein the first plurality of concave-convex portions are arranged on the second surface of the first semiconductor substrate in a region corresponding to the anode region in a substrate thickness direction of the first semiconductor substrate.

6. The avalanche photodiode sensor according to claim 2, wherein the element separation portion further includes third and fourth element separation regions that define the first photoelectric conversion portion in a different direction from the first and second element separation regions, and
the first plurality of concave-convex portions are arranged on the second surface of the first semiconductor substrate in a cross-shaped region that divides a rectangular region defined by the first to fourth element separation regions into four.

7. The avalanche photodiode sensor according to claim 2, wherein the element separation portion further includes third and fourth element separation regions that define the first photoelectric conversion portion in a different direction from the first and second element separation regions, and
the first plurality of concave-convex portions are arranged on the second surface of the first semiconductor substrate at each of four corners of a rectangular region defined by the first to fourth element separation regions.

8. The avalanche photodiode sensor according to claim 2, wherein the first plurality of concave-convex portions are arranged on the second surface of the first semiconductor substrate in a cross-shaped region corresponding to the cathode region in a substrate thickness direction of the first semiconductor substrate.

9. The avalanche photodiode sensor according to claim 1, wherein the first photoelectric conversion portion is an avalanche photodiode.

10. The avalanche photodiode sensor according to claim 1, wherein each of the first and second element separation regions includes a reflective film or a high refractive index film.

11. The avalanche photodiode sensor according to claim 1, wherein each of the first and second element separation regions penetrates the first semiconductor substrate from the first surface to the second surface.

12. The avalanche photodiode sensor according to claim 1, wherein the first plurality of concave-convex portions are arranged on the second surface of the first semiconductor substrate in an entire region defined by the first and second element separation regions.

13. The avalanche photodiode sensor according to claim 1, wherein the first semiconductor substrate further includes a light transmitting film provided inside the trench.

14. An avalanche photodiode sensor, comprising:
a first semiconductor substrate; and
a second semiconductor substrate bonded to a first surface of the first semiconductor substrate,
wherein the first semiconductor substrate includes:
   a plurality of photoelectric conversion portions arranged in a matrix;
   an element separation portion for element-separating the plurality of photoelectric conversion portions from each other,
   wherein the plurality of photoelectric conversion portions include a first photoelectric conversion portion,
   wherein the element separation portion has a first element separation region and a second element separation region,
   wherein the first photoelectric conversion portion is arranged between the first element separation region and the second element separation region,
   wherein the first semiconductor substrate further includes a first plurality of concave-convex portions arranged on a second surface of the first semiconductor substrate opposite to the first surface of the first semiconductor substrate and arranged between the first element separation region and the second element separation region, and wherein the second semiconductor substrate includes a reading circuit connected to each of the photoelectric conversion portions; and a flattening film extending above and across the first plurality of concave-convex portions and the element separation portion, wherein a trench is provided on the second surface of the first semiconductor substrate in at least a part of a region defined by the first and second element separation regions, and wherein the first semiconductor substrate further includes a second plurality of concave-convex portions provided on a bottom surface of the trench.

15. The avalanche photodiode sensor according to claim 14, wherein each of the first and second element separation regions includes a reflective film or a high refractive index film.

16. The avalanche photodiode sensor according to claim 14, wherein each of the first and second element separation regions penetrates the first semiconductor substrate from the first surface to the second surface.

17. A distance measuring device, comprising:
a light emitting portion configured to emit light of a predetermined wavelength;
an avalanche photodiode sensor configured to generate a pixel signal from received light; and
a calculation unit configured to calculate a distance to an object based on the pixel signal generated by the avalanche photodiode sensor,
wherein the avalanche photodiode sensor includes:
a first semiconductor substrate; and
a second semiconductor substrate bonded to a first surface of the first semiconductor substrate,
wherein the first semiconductor substrate includes:
a plurality of photoelectric conversion portions arranged in a matrix;
an element separation portion for element-separating the plurality of photoelectric conversion portions from each other,
wherein the plurality of photoelectric conversion portions include a first photoelectric conversion portion,
wherein the element separation portion has a first element separation region and a second element separation region,
wherein the first photoelectric conversion portion is arranged between the first element separation region and the second element separation region, wherein the first semiconductor substrate further includes a plurality of concave-convex portions arranged on a second surface of the first semiconductor substrate opposite to the first surface of the first semiconductor substrate and arranged between the first element separation region and the second element separation region, and wherein the second semiconductor substrate includes a reading circuit connected to each of the photoelectric conversion portions; and a flattening film extending above and across the plurality of concave-convex portions and the element separation portion, wherein a trench is provided on the second surface of the first semiconductor substrate in at least a part of a region defined by the first and second element separation regions, and wherein the first semiconductor substrate further includes a light transmitting film provided inside the trench.

18. The distance measuring device according to claim 17, wherein the first photoelectric conversion portion includes a cathode region of a first conductive type provided on the first surface of the first semiconductor substrate and an anode region of a second conductive type opposite to the first conductive type, the anode region being provided on the first surface.

19. The distance measuring device according to claim 18, wherein the element separation portion further includes third and fourth element separation regions that define the first photoelectric conversion portion in a different direction from the first and second element separation regions, and
the plurality of concave-convex portions are arranged on the second surface of the first semiconductor substrate in a cross-shaped region that divides a rectangular region defined by the first to fourth element separation regions into four.

20. The distance measuring device according to claim 18, wherein the element separation portion further includes third and fourth element separation regions that define the first photoelectric conversion portion in a different direction from the first and second element separation regions, and
the plurality of concave-convex portions are arranged on the second surface of the first semiconductor substrate at each of four corners of a rectangular region defined by the first to fourth element separation regions.

* * * * *